United States Patent
De Heyn et al.

(10) Patent No.: US 6,707,110 B2
(45) Date of Patent: Mar. 16, 2004

(54) LAYOUT CONFIGURABLE ELECTROSTATIC DISCHARGE DEVICE FOR INTEGRATED CIRCUITS

(75) Inventors: Vincent De Heyn, Braives (BE); Guido Groeseneken, Leuven (BE); Louis Vacaresse, Toulouse (FR); Geert Gallopyn, Zottegem (BE); Hugo Van Hove, Maarkedal (BE)

(73) Assignees: Interuniversitair Microelektronica Centrum, Leuven (BE); Alcatel SA, Paris (FR)

( * ) Notice: Subject to any disclaimer, the term of this patent is extended or adjusted under 35 U.S.C. 154(b) by 0 days.

(21) Appl. No.: 10/131,924

(22) Filed: Apr. 25, 2002

(65) Prior Publication Data

US 2003/0006464 A1 Jan. 9, 2003

Related U.S. Application Data

(60) Provisional application No. 60/286,826, filed on Apr. 27, 2001.

(30) Foreign Application Priority Data

Jan. 21, 2002 (EP) .............................. 02290153

(51) Int. Cl.$^7$ ............................................... H01L 23/62
(52) U.S. Cl. ...................... 257/362; 257/361; 257/355; 257/173; 257/175
(58) Field of Search ............................... 257/362, 361, 257/355, 173, 175

(56) References Cited

U.S. PATENT DOCUMENTS 5,268,588 A * 12/1993 Marum ..................... 257/362
5,341,005 A * 8/1994 Canclini ................... 257/173
5,602,409 A * 2/1997 Olney ........................ 257/362

FOREIGN PATENT DOCUMENTS

EP          0532481 A1 *  3/1993
WO          99 21229        4/1999

* cited by examiner

Primary Examiner—Nathan J. Flynn
Assistant Examiner—Remmon R. Fordé
(74) Attorney, Agent, or Firm—McDonnell Boehnen Hulbert & Berghoff

(57) ABSTRACT

Electrostatic discharge protection device comprising a first highly p-doped region with a base contact, a first highly n-doped region with a collector contact, a second highly n-doped region with an emitter contact and located between the first highly p-doped region and the second highly n-doped region, the first highly p-doped region and the second highly n-doped region being applied in a weakly p-doped region which a has a lateral overlap extending towards the first highly n-doped region, the lateral overlap having a width, the first highly n-doped region being applied in a weakly n-doped region, the weakly p-doped region and the weakly n-doped region being applied in a more weakly n-doped region, and a highly n-doped buried layer located underneath the more weakly n-doped region and extending below at least a portion of the weakly n-doped region and at least a portion of the weakly p-doped region. The device enables a lateral current component from the first highly n-doped region in the direction of the second highly n-doped region and a vertical current component from the first highly n-doped region via the buried layer in the direction of the second highly n-doped region. The width of the lateral overlap of the weakly p-doped region is determined in function of the predetermined ratio between the lateral current component and the vertical current component.

11 Claims, 24 Drawing Sheets

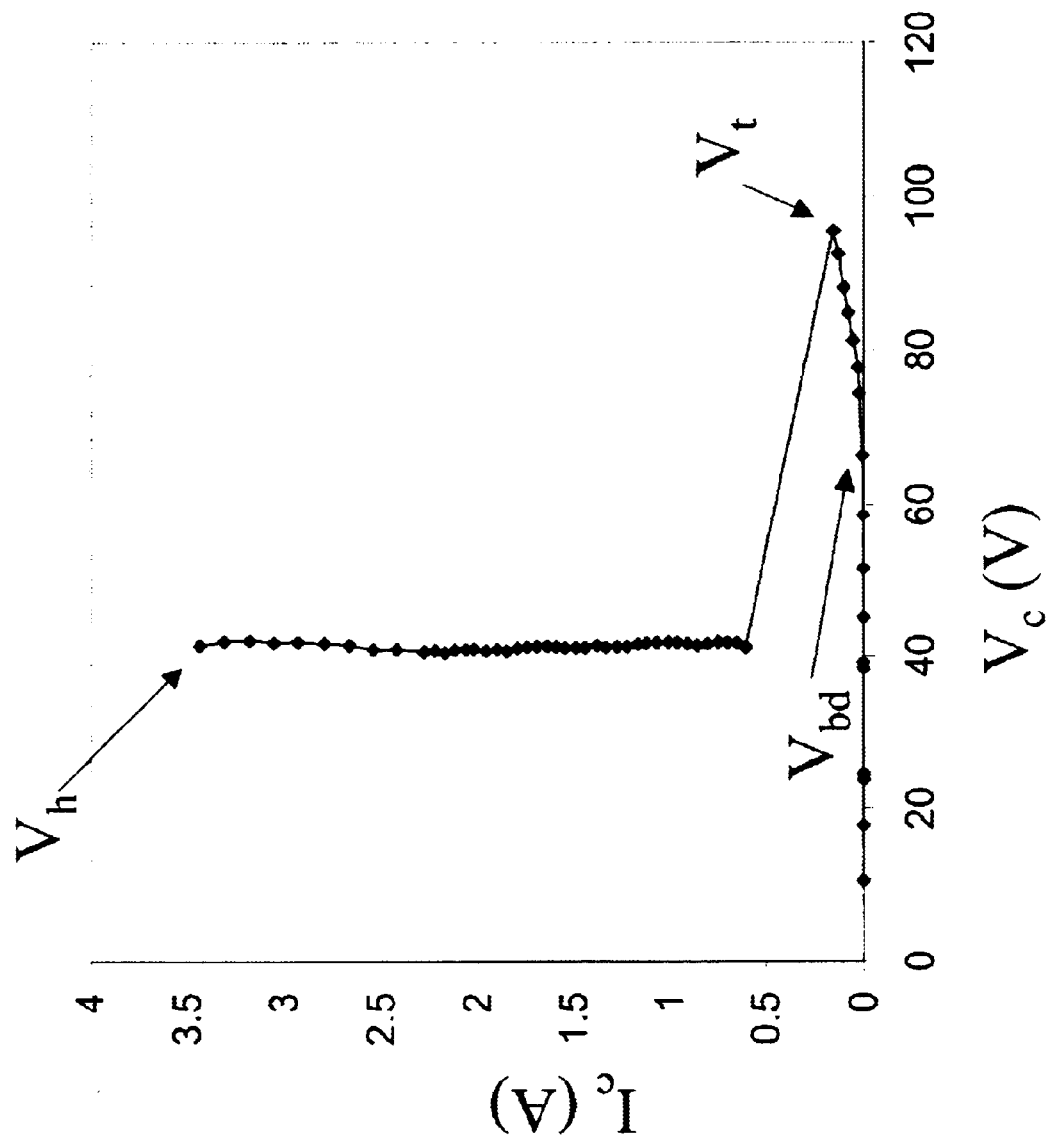
Figure 1: prior art

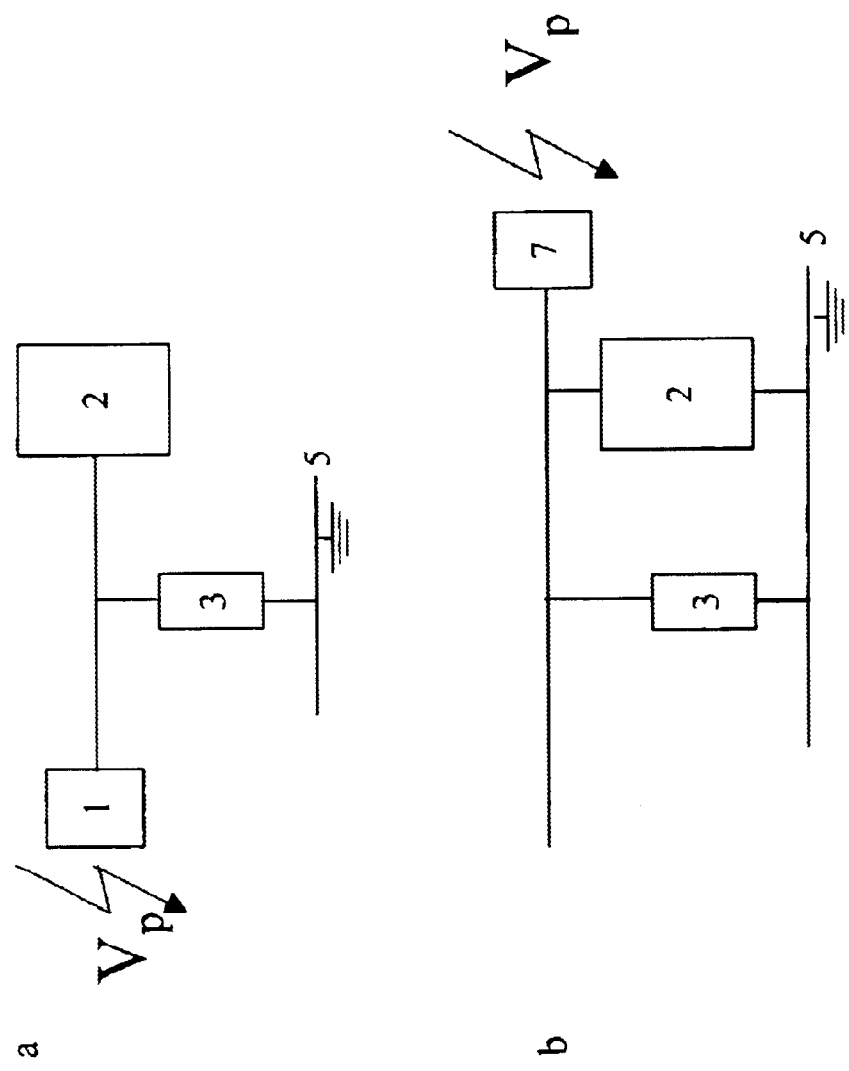
Figure 2: prior art

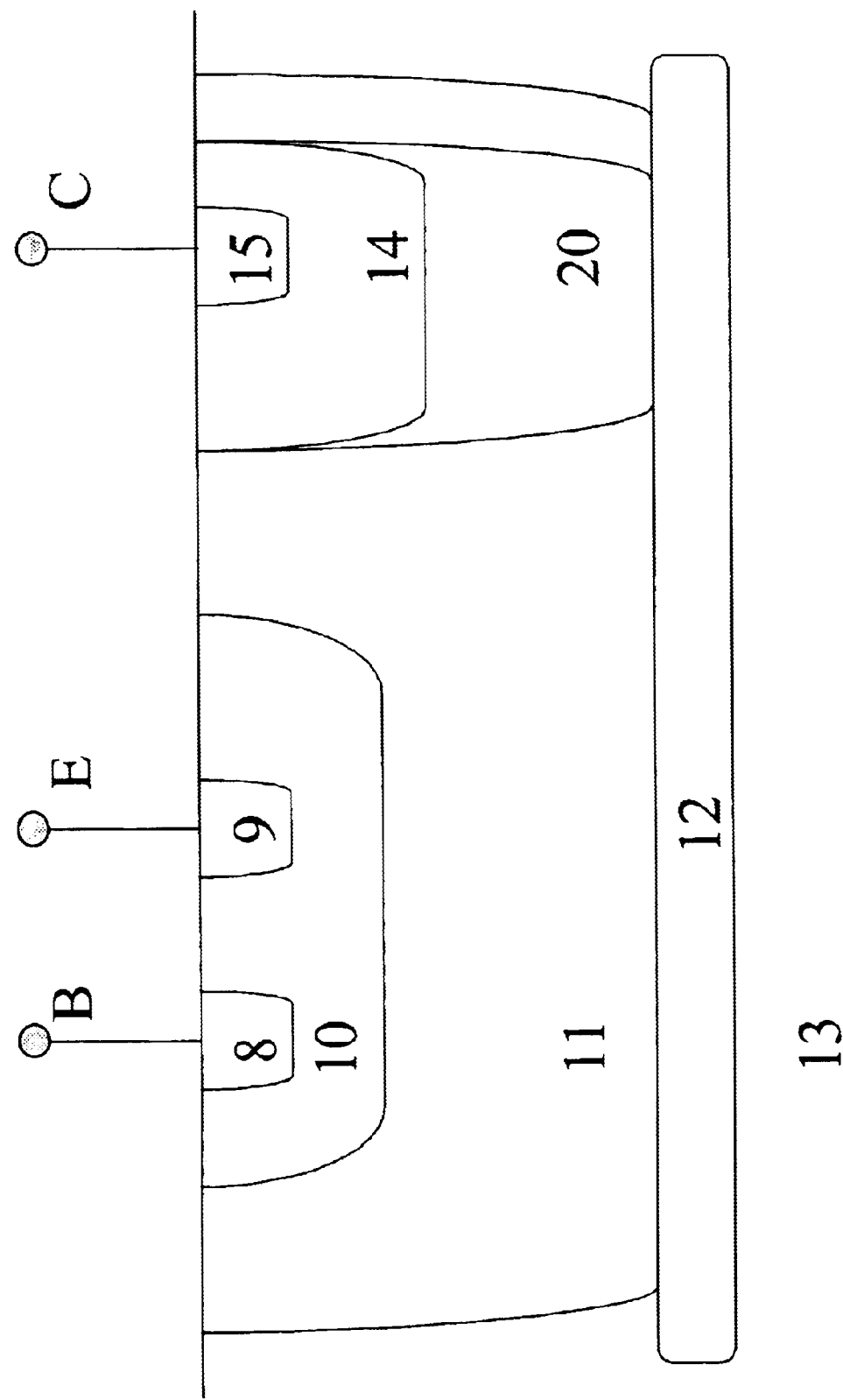
Figure 3: prior art

LAYOUT CONFIGURABLE ELECTROSTATIC DISCHARGE DEVICE FOR INTEGRATED CIRCUITS

REFERENCE TO RELATED APPLICATIONS

This application claims priority benefits to U.S. provisional application Serial No. 60/286,826, filed on Apr. 27, 2001, entitled "Layout configurable Electrostatic Discharge Device for integrated circuits." This application also claims priority to European Patent Application EP 02290153.2 filed on Jan. 21, 2001. This application incorporates by reference U.S. provisional application Serial No. 60/286,826 in its entirety. This application also incorporates by reference European Patent Application EP 02290153.2 in its entirety.

FIELD OF THE INVENTION

The present invention relates to an Electrostatic Discharge (ESD) protection device according to the preamble of the first claim.

BACKGROUND OF THE INVENTION

The more and more extensive use of smart power technology in demanding environments, such as automotive applications, requires appropriate and specific Electro Static Discharge (ESD) protection devices. Integrated circuits (IC) used for such harsh applications require a high ESD robustness and latch-up free operation and they have to operate at high operating temperatures and voltages. FIG. 1 shows a current voltage curve of a typical prior art bipolar ESD device, having a breakdown voltage $V_{bd}$ of about 65V, a trigger voltage $V_t$ of about 95V and a holding voltage $V_h$ of about 40V.

To provide an effective ESD protection for the whole integrated circuit, on-chip ESD protection circuits are added to the input/output pads (I/O) (1) and supply pads (7) of the IC (2) (cf. FIG. 2). The specifications of such on-chip ESD protection circuits such as triggering voltage and holding voltage are different for an Input/Output structure (I/O-port) and a power supply. In case of e.g. an I/O-port shown in FIG. 2a, a voltage peak $V_p$ or discharge on the input bonding pad (1) transferred to the chip (2) must be limited in order to prevent damage of the input of subsequent devices and circuits (2). This requires an ESD device (3) that triggers and holds at a low voltage, avoiding a permanent overload of the circuit (2). The breakdown voltage $V_{bd}$ and trigger voltage $V_t$ such ESD device must be less than a specified maximum voltage $V_{max}$. On the other hand a power supply line providing power from the supply pad (7) to the circuit (2), as shown in FIG. 2b, must maintain a high enough voltage, to prevent unwanted switching off of a circuit due a voltage drop on this supply line. This requires an ESD device (3) with a breakdown voltage $V_{bd}$ and a holding voltage $V_h$ that are above a minimal voltage $V_{min}$ to maintain a specified minimal supply voltage. Table 1 summarises typical requirements for an ESD structure used in I/O and power supply of an integrated circuit to be used in automotive applications. The corresponding ESD protections are nowadays designed for each application or circuit.

From WO-A-99/21229, a self-triggered bipolar device is known which is used as ESD protection device in smart power technology. WO-A-99/21229 describes a lateral bipolar device used as an electrostatic discharge device. The collector of this bipolar device consists of a highly doped region and a lowly doped region adjacent to the base region. The voltage applied to the collector electrode at which this bipolar device triggers, depends on the width of this lowly doped collector region. In other words, the width of this lowly doped collector region is a layout parameter which can be predetermined for selecting a desired trigger voltage of the bipolar device. The holding voltage of the bipolar device is however substantially independent from this parameter.

AIM OF THE INVENTION

It is an aim of the present invention to provide an electrostatic discharge device of which the holding voltage can be predetermined.

SUMMARY OF THE INVENTION

For the purpose of clarity, the invention will be described in the following for an npn bipolar device. However, it should be apparent that the invention also relates to pnp bipolar devices.

The (npn) ESD protection device according to one aspect of the invention comprises a first highly p-doped region provided with a base contact, a first highly n-doped region provided with a collector contact and, in between, a second highly n-doped region provided with an emitter contact. The first highly doped p-doped region and the second highly n-doped region are applied or formed in a weakly p-doped region. This weakly p-doped region has a lateral overlap which extends towards the first highly n-doped region, the lateral overlap has a predetermined width "d". The first highly n-doped region is applied in a weakly n-doped region. This weakly n-doped region and the weakly p-doped region are applied in a more weakly n-doped region. A highly n-doped buried layer (BLN) is located underneath the more weakly n-doped region and extends below at least a portion of the weakly n-doped region and at least a portion of the weakly p-doped region.

The first highly p-doped region has a doping concentration above that of the weakly p-doped region. The first highly n-doped region has a doping concentration above that of the weakly n-doped region, which in turn has a doping concentration above that of the weakly n-doped region. The highly n-doped buried layer (BLN) has a doping concentration above that of the weakly n-doped region. Because of its structure, the ESD device is provided for enabling a lateral current component from the first highly n-doped region in the direction of the second highly n-doped region and a vertical current component from the BLN in the direction of the second highly n-doped region.

In order to control the holding voltage of the ESD-device according to the invention, the layout parameter "d" is varied. It has been found that by varying the "d" parameter, it can be determined how electrical current will flow through the device in holding state, i.e. after the breakthrough voltage is reached and the device snaps back to the holding voltage. At smaller values of "d", the current will flow more laterally, i.e. more near the surface of the device, than at larger values of "d", at which the current will flow more vertically. In other words, for smaller values of "d" the lateral current component is favoured, whereas for larger values of "d" the vertical current component is favoured. Because of this possible selection between the vertical and the lateral current components, multiplied by the collector resistance of the device in the conductive state, the "d" parameter enables a selection in a range of obtainable holding voltages for the ESD device of the invention in the conductive state.

In the ESD device of the invention, the more weakly n-doped region separates the weakly n-doped region from the BLN. This means that a sinker region is omitted in the device of the invention. Such a sinker region is used in the prior art to connect the weakly n-doped region with the BLN and forms a reduction in the collector resistance of the device. However, this reduction in the collector resistance doesn't provide an adequate solution in the device of the invention, as this leads to a predominance of the vertical current component. The "d" parameter would have to be chosen so small in order to make the lateral current component dominant, that there would be substantially no lateral overlap of the weakly p-doped region left. The width of the overlap would have to be reduced to a physically unobtainable size. So if a sinker region were present, it would become substantially impossible to select a ration for the lateral and the vertical current components and as such substantially impossible to obtain a desired holding voltage of the device by choosing a value for "d".

Furthermore, the implementation of a sinker region in an ESD device requires a full BiCMOS process. Omitting the sinker region has the economic advantage that the device of the invention can be produced in a simplified or reduced BiCMOS process, which makes it possible to reduce the number of patterning and implementation steps.

An advantage of the present invention is that it offers an ESD structure with which a desired holding voltage can be easily achieved by adapting the layout. As this can be achieved by changing only one layout parameter, this offers an easy, flexible and cost-effective solution.

Because of the above-described structure of the ESD device according to the invention, the device can be seen as comprising a lateral transistor and a vertical transistor. The lateral transistor enables the lateral current component and is formed by the sequence of the second highly n-doped region, the weakly p-doped region, the weakly n-doped region and the first highly n-doped region. The vertical transistor enables the vertical current component and is formed is formed by the sequence of the second highly n-doped region, the weakly p-doped region, the more weakly n-doped region and the highly n-doped buried layer. By varying the width "d" of the lateral overlap of the weakly p-doped region according to the invention, it can be determined which of these two transistors "snaps back" first, i.e. which of these two transistors becomes active at the triggering voltage of the device and will, as a result, determine the holding voltage of the device in use. Preferably, "d" is chosen such that the holding voltage of the device is determined by either the lateral or the vertical transistor. Choosing "d" in such a way that the holding voltage is only determined by either the lateral or the vertical transistor has the advantage that the stability of the holding voltage can be enhanced, i.e. that the current dependency of the holding voltage can be reduced.

For lower values of "d", the holding voltage is determined by the lateral transistor, whereas for higher values of "d", the holding voltage is determined by the vertical transistor. For intermediate values of "d", the lateral and vertical transistors are in competition, which leads to a holding voltage having an intermediate value.

Preferably, the more weakly n-doped region separates the weakly p-doped region and the weakly n-doped region by a first predetermined distance "t". This distance "t" can be chosen in function of the trigger voltage of the device in use.

In a preferred embodiment of the ESD device according to the invention, a second highly p-doped region is provided in the lateral overlap of the weakly p-doped region. This second highly p-doped region changes the carrier density in the lateral overlap and hence the gain of the lateral device. Providing the second highly p-doped region in the lateral overlap has the same effect as choosing a larger value for the width "d" of the lateral overlap. In this way, providing the second highly p-doped region allows a reduction of the width "d" of the lateral overlap in comparison with a lateral overlap without such second highly p-doped region. This has the advantage that the size of the ESD device of the invention can be reduced.

In another preferred embodiment of the ESD device according to the invention, the buried layer is laterally separated from the second highly n-doped region by a second predetermined distance "b". A lateral separation may also be applied on the other side of the buried layer, namely by laterally separating the buried layer from the first highly n-doped region by a third predetermined distance "c". The lateral separations "b" and "c" may also be combined. Laterally separating the buried layer on one or both sides involves an increase in the collector resistance of the vertical bipolar and as such forms an alternative way of controlling the holding voltage of the device. In other words, the distances "b" and "c" form further parameters for tuning the holding voltage of the device in use.

In the ESD device of the invention, the weakly p-doped region preferably separates the first highly p-doped region from the second highly n-doped region. The first highly p-doped region and the second highly n-doped region may however also contact each other.

In another embodiment of the ESD device of the invention, the weakly p-doped region contacts the weakly n-doped region, i.e. the "t"-parameter is chosen zero. As a result, a predetermined selection of the trigger voltage is not possible in this embodiment. It can however be advantageous when such a selection is unimportant, as this embodiment has a simpler structure.

The invention also relates to devices comprising first and second ESD devices according to one of the above-described embodiments, the width "d" of the overlap of the first ESD device being different from that of the second ESD device. In this way a device is provided which is suitable for sustaining two different holding voltages, one being determined by the first ESD device and the other by the second ESD device.

BRIEF DESCRIPTION OF THE DRAWINGS

The invention will be further elucidated by means of the following description and the appended drawings. The drawings are schematic representations of the invention and therefore the dimensions and the relative dimensions do not correspond to actual reductions to practice of the invention.

FIG. 1 shows the collector current-voltage (I/V) curve of a prior art bipolar ESD device showing typical ESD performance parameters.

FIG. 2 shows a schematic representation of an I/O structure (a) and a power supply structure (b) known from the prior art.

FIG. 3 shows a schematic cross-section of a lateral bipolar device manufactured in a prior art full BiCMOS process.

FIGS. 4b–c show the doping profiles in vertical direction of the device of FIG. 4a.

FIG. 6 shows an electrical equivalent scheme of the embodiment of FIG. 5a.

FIG. 13c shows the doping profiles in vertical direction of the device of FIG. 13a.

Figure 4A:
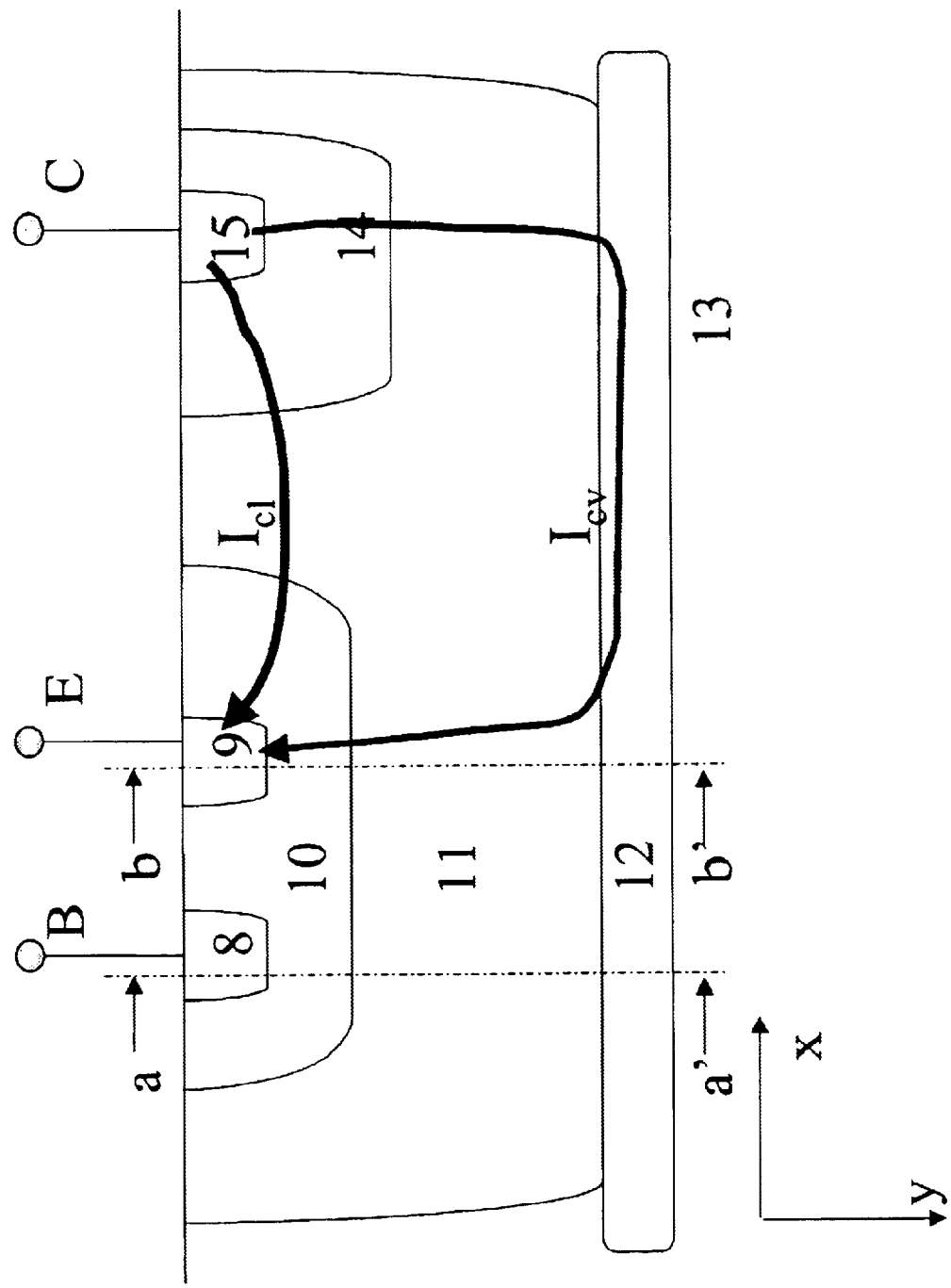
FIG. 4a shows a schematic cross-section of a lateral bipolar device manufactured in a simplified BiCMOS process, according to the present invention.

Table 1, below, gives an overview of typical ESD specifications as used in automotive applications.

DETAILED DESCRIPTION OF THE INVENTION

In a first aspect of the invention, an ESD structure comprising two bipolar devices, processed in a modified BiCMOS technology, is disclosed.

For the purpose of teaching the present invention a 0.7 µm analogue BiCMOS technology with additional high voltage, memory and bipolar modules will be used. This BiCMOS technology is not optimised towards bipolar characteristics for reasons of cost and process time. The present invention is however also applicable to other BiCMOS technologies having larger or smaller, even submicron, dimensions. In the drawings, ESD structures comprising npn bipolar devices are used, but the present invention is also applicable to ESD structures comprising pnp bipolar devices, by changing n-type regions with p-type regions and vice-versa.

The measurements described below were performed using an on-wafer TLP (Transmission Line Pulse) system, with a pulse width of 100 ns, 700 ps rise time and current amplitudes of 5 mA to 4 A with step size of 10 mA [11]. Unlike the Human Body Measure (HBM) tests, TLP measurement allows to extract the triggering voltage, the holding voltage and the "ON" resistance, as well as the robustness (It2 (A mm$^2$).1.5≈HBM value in kV). The failure criterion, "a sudden measurable and significant increase of the leakage current, above the detection limits of the tool", is used for all the measurements shown. Typically this stepwise increase of the leakage current of the device results in a two- to five-fold increase or even more of the leakage current. The leakage current of the device under test is measured at a fixed voltage, e.g. at the supply voltage, which is about 5V for a 0.7 µm technology.

FIG. 3 outlines the cross-section of a prior art lateral bipolar device manufactured in a full BiCMOS process. The device is implemented on a p-type substrate 13 and comprises a first highly p-doped region 8 provided with a base contact B, a first highly n-doped region 15 provided with a collector contact C and, in between, a second highly n-doped region 9 provided with an emitter contact E. In the following, the first highly p-doped region 8 is referred to as the base contact region 8, the first highly n-doped region 15 as the collector contact region 15 and the second highly n-doped region 9 as the emitter region 9. The base contact region 8 and the emitter region 9 are applied in a weakly p-doped region 10, referred to as the p-body 10, which separates them from each other. The collector region of the bipolar device comprises in fact several n-type regions doped to a different level: the highly n-doped collector contact region 15 is applied in a weakly n-doped region 14, referred to as the n-well 14; underneath the n-well 14 a sinker region 20 is provided of about the same doping level as the n-well 14; a highly n-doped buried layer (BLN) 12 contacts and extends below the sinker region 20; the BLN 12 further extends below a more weakly n-doped region 11, referred to as the n-tub 11, which surrounds the p-body 10 and separates it from the BLN 12, the n-well 14 and the sinker region 20.

FIG. 4a outlines the cross-section of a first embodiment of the bipolar device according to the invention. A characteristic feature of the device according to the present invention is the absence of the sinker region 20 (FIG. 3). In the prior art device, the sinker 20 is used to decrease the collector resistance of the bipolar device. In the bipolar device of the invention, the omitting of the sinker 20 advantageously increases the difference between the resistance in lateral direction, i.e. directly between the emitter region 9 and the collector contact region 15, and the resistance in vertical direction, i.e. via the BLN 12, in the conductive state of the device. According to the invention, the increase in difference between the resistances has shown that the "d"-parameter, which is defined as the width of the lateral overlap of the p-body 10 towards the collector contact region 15, can efficiently be used to influence the holding voltage of the device in use. This makes the bipolar structure of the invention suitable for use as ESD protection device. Furthermore, the omitting of the sinker region 20 has the economic advantage that the device can be manufactured in a simplified or reduced BiCMOS process, with a reduced number of patterning and implantation steps with respect to a full BiCMOS process.

The bipolar device shown in FIG. 4a comprises a lateral bipolar device, which enables the lateral current component $I_{cl}$, and a parasitic vertical bipolar device, which enables the vertical current component $I_{cv}$. The lateral bipolar device is formed by the sequence of the emitter region 9, the p-body 10, the n-well 14 and the collector contact region 15. The vertical bipolar device is formed by the sequence of the emitter region 9, the p-body 10, the n-tub 11 and the BLN 12. According to the invention, the parameter "d", i.e. the width of the lateral overlap of the p-body 10 towards the collector contact region 15, is preferably chosen such that either the lateral current component $I_{cl}$ is dominant, or the vertical current component $I_{cv}$ is dominant. As a result the "d" parameter is preferably chosen such that the holding voltage of the device in the conductive state is determined by either the lateral bipolar or the vertical bipolar. For smaller values of "d" the lateral current component $I_{cl}$ is dominant and the holding voltage of the device in the conductive state is determined by the lateral transistor. For larger values of "d" the vertical current component $I_{cv}$ is dominant and the holding voltage of the device in the conductive state is determined by the vertical transistor. For intermediate values of "d" the lateral and vertical current components $I_{cl}$ and $I_{cl}$ are in competition, with a holding voltage of the device in use being mainly determined by the vertical transistor for lower currents and mainly determined by the lateral current for higher currents. (see FIG. 7).

In the device of FIG. 4a, the p-body region 10 separates the base contact region 8 from the emitter region 9. The base contact region 8 and the emitter region 9 may however also contact each other, in which case the base and emitter contacts B and E may be constructed as a single contact (not shown).

In the device of FIG. 4a, the p-body 10 and the n-well are separated from each other by the n-tub 11. They may however also contact each other, as is for example shown in the embodiments of FIGS. 13–15. In these embodiments, the p-body 10 is referred to as the p-well 17, which is also a weakly p-doped region, but which specifies the difference in structure with respect to the other embodiments of the invention (shown in FIGS. 5–11).

The doping level of the weakly doped p-regions, i.e. p-well 17 or p-body 10 will be in the range of 1e16 to 1e17 cm$^{-3}$. The doping level of the weakly doped n-regions, i.e. n-tub 11 will be in the range of 1e15 to 1e16 cm$^{-3}$. Highly doped regions, such as the emitter n+ 9 and base contact p+ 8 regions will be doped above a doping level of 1e19 cm$^{-3}$. The n+ buried layer 12 will be in the range of 1e16 to 1e18 cm$^{-3}$. Typical peak concentrations of the various doping regions of the 0.7 μm BiCMOS technology used are:

highly n-doped emitter region 9: 1e20 cm–3,
highly p-doped base contact region 8: 7e19 cm–3,
weakly doped p-body region 10: 2e17 cm–3,
weakly doped n-tub region 11: 2e15 cm–3,
highly doped BLN 12: 7e18 cm–3,
weakly doped p-well region 17: 3e16 cm–3.

Figure 4B:
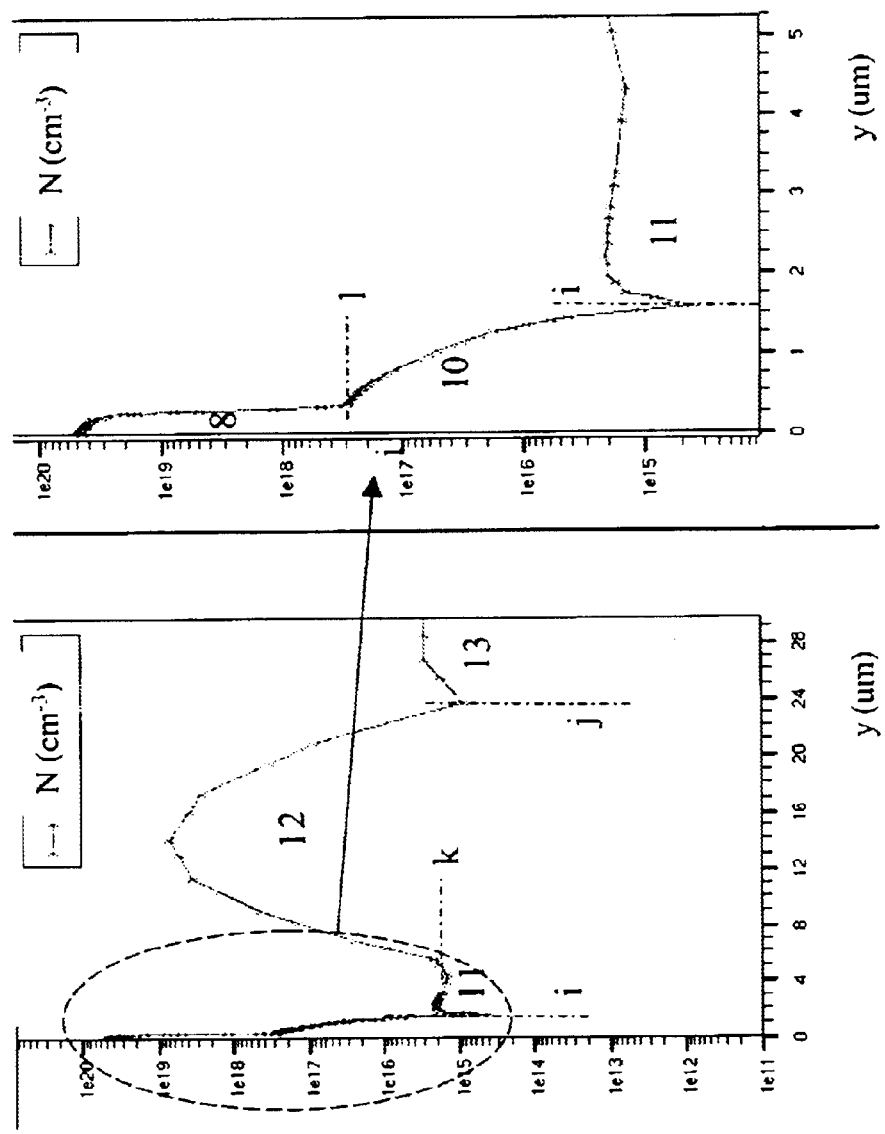
Figure 4C:
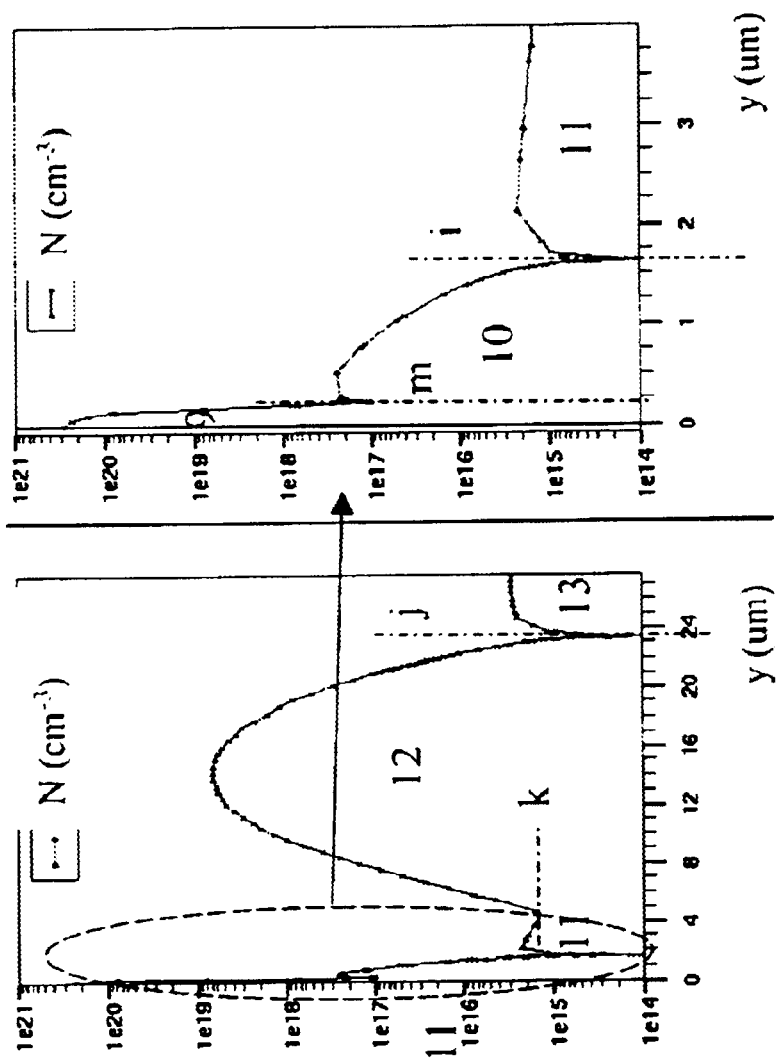

FIGS. 4b–c show the doping profiles in vertical direction of the devices. FIG. 4b shows the metallurgical junction (i) between the base contact region 8—p-body region 10 on the one hand and the n-tub 11—BLN layer 12 on the other hand. The metallurgical junction (j) between the BLN layer 12 and the p-substrate 13 is also shown. The bends in the graph show the transitions from one region to another, e.g. the transition (i) from the p+ region 8 and the p-body 10. Each bend in the graph represents a change in concentration. The bend (k) also represents the difference in doping level between the n-tub 11 and the BLN 12. In the BLN 12, the graph peaks towards a doping level on the order of 1e19 cm–3

FIG. 4c shows the metallurgical junction (m) between the emitter contact region 9 and the p-body region 10 and between (i) the p-body 10 and the n-tub region 11. The metallurgical junction (j) between the BLN layer 12 and the p-substrate 13 is also shown. The change (k) in concentration between the n-tub 11 and the BLN 12 is indicated.

Figure 5A:
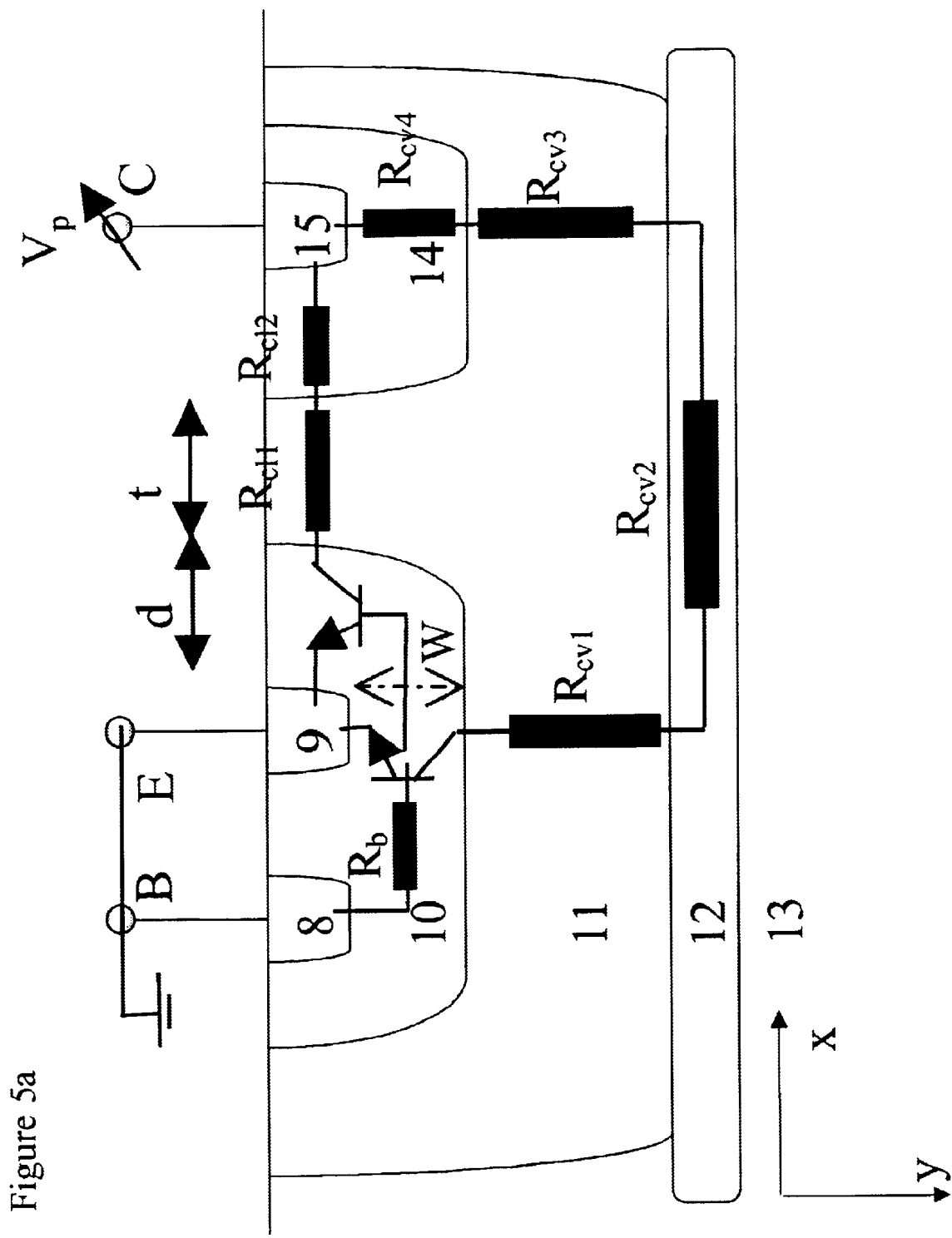
FIG. 5a shows a schematic cross-section of a lateral bipolar device manufactured in a simplified BiCMOS process, according to the present invention, in which the electronic elements of the ESD structure are indicated.
Figure 5B:
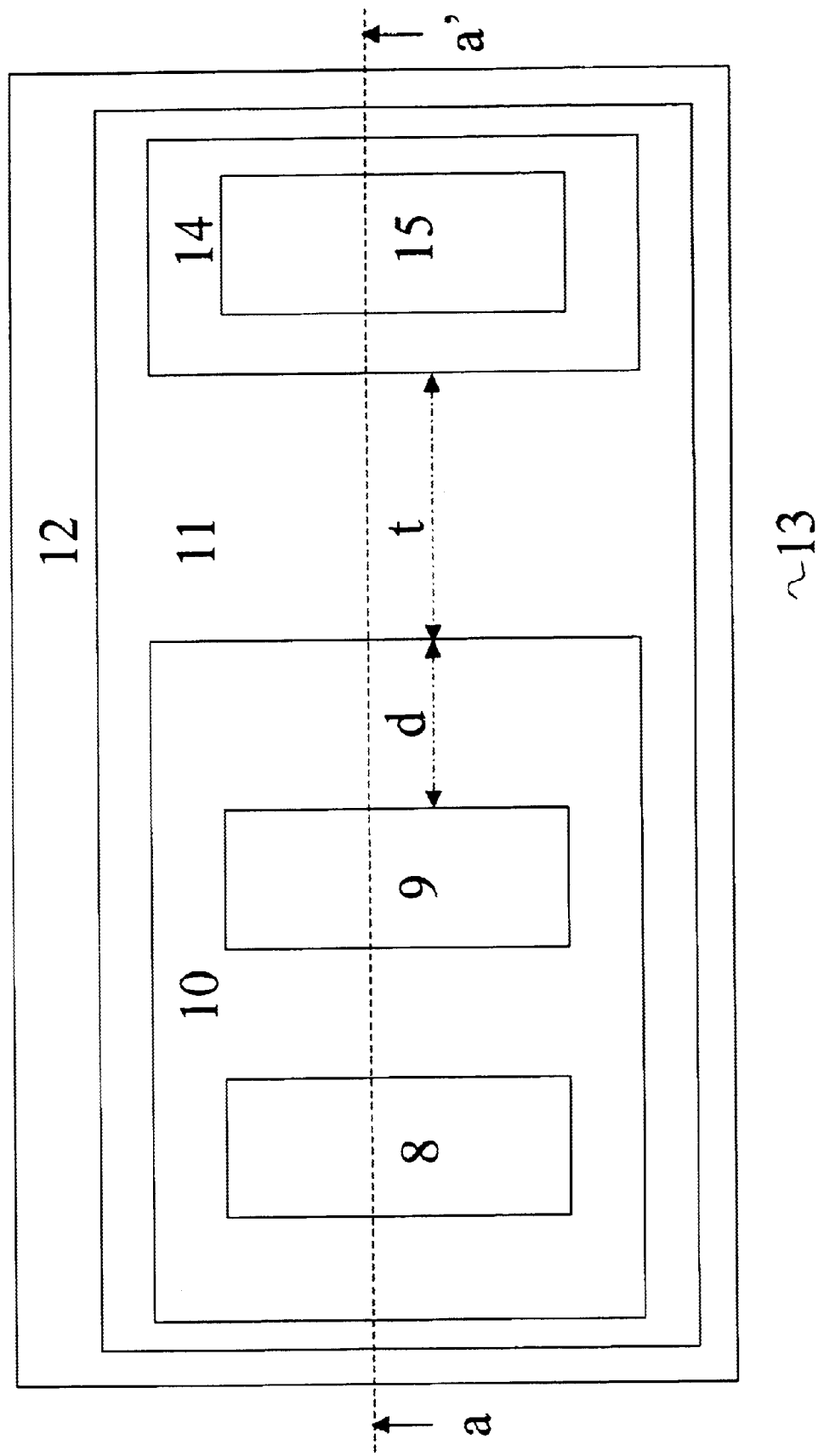
FIG. 5b shows a schematic top view of the device shown in FIG. 5a, A—A' being the line on which the cross section of FIG. 5a is taken.

FIGS. 5a and 5b outline the electrical equivalent structure of the lateral and vertical device shown in FIG. 4a. The lateral device has a basewidth "d" defined by the lateral distance between the n+ contact region 9 forming the emitter and the n-tub region 11. The collector resistance of the lateral device is determined by the resistance $R_{cl1}$ of the weakly doped n-tub region 11 and by the resistance $R_{cl2}$ of the more weakly doped n-well region 14. The vertical device on the other hand has a basewidth W defined by the difference in depth between the p-body 10 base region and the n+ contact region 9 forming the emitter. This vertical basewidth is fixed for a given process for producing the device. The collector resistance of the vertical device is determined by the resistance $R_{cv1}$ and $R_{cv3}$ of the weakly doped n-tub region 11, by the resistance $R_{cv12}$ of the a highly doped buried layer region (BLN) 12 and by the resistance $R_{cv2}$ of the weakly doped n-well region 14. Although both devices are connected with a common base, the characteristics of both base regions can be different. The base widths d and W can differ as can be seen in FIGS. 4 and 5, but also the doping levels can be different e.g. due the vertical dopant profile of the p-body.

Figure 6:
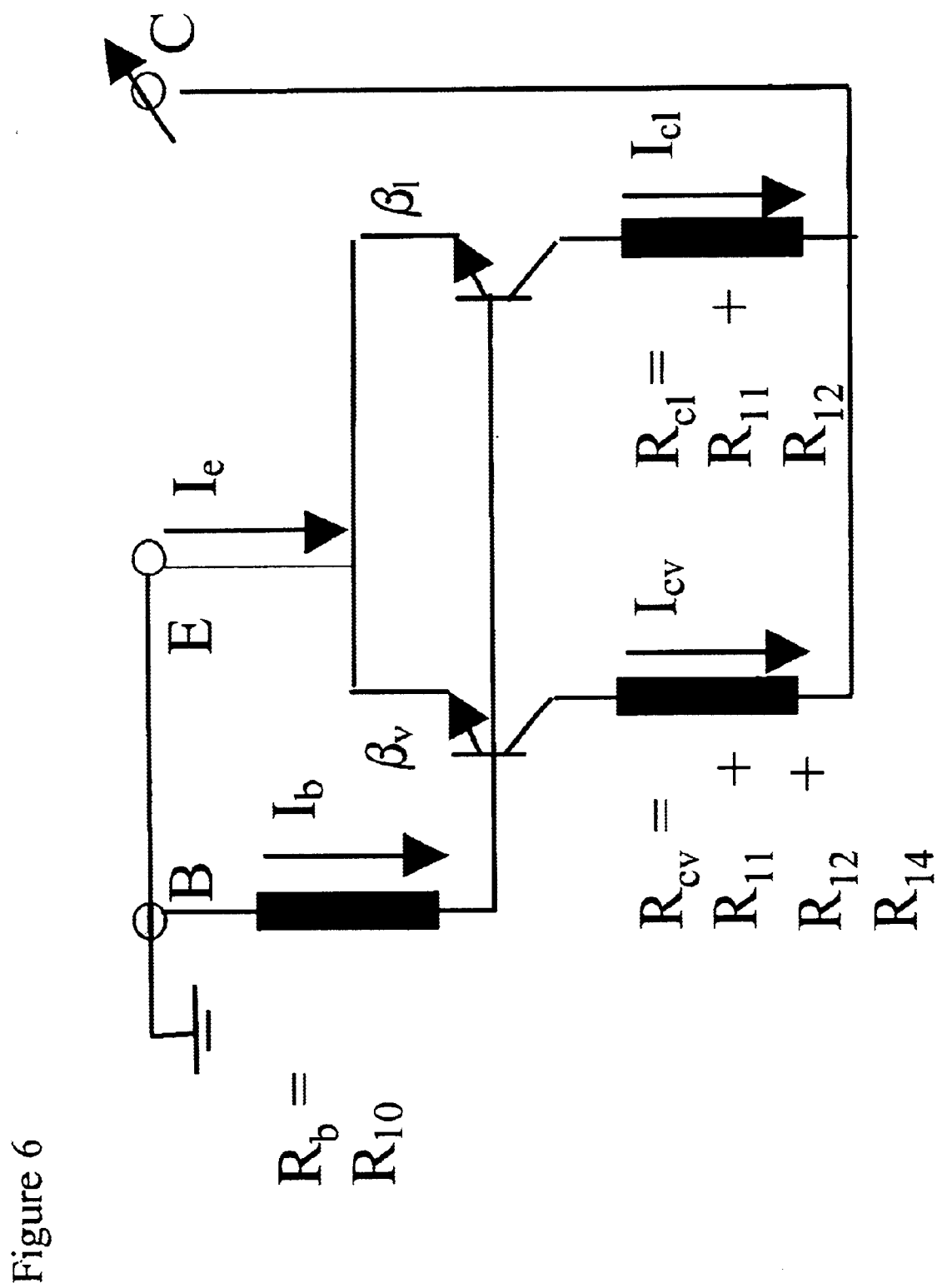

The two bipolar devices have a common base, emitter and collector connection as shown in the simplified electrical equivalent structure of the ESD device given in FIG. 6. In use, the base and emitter are electrically connected to the same potential, in this example the ground potential, while the collector is electrically connected to a bond pad (1 or 7). The numbering of each resistor refers to the corresponding dopant region.

Figure 7:
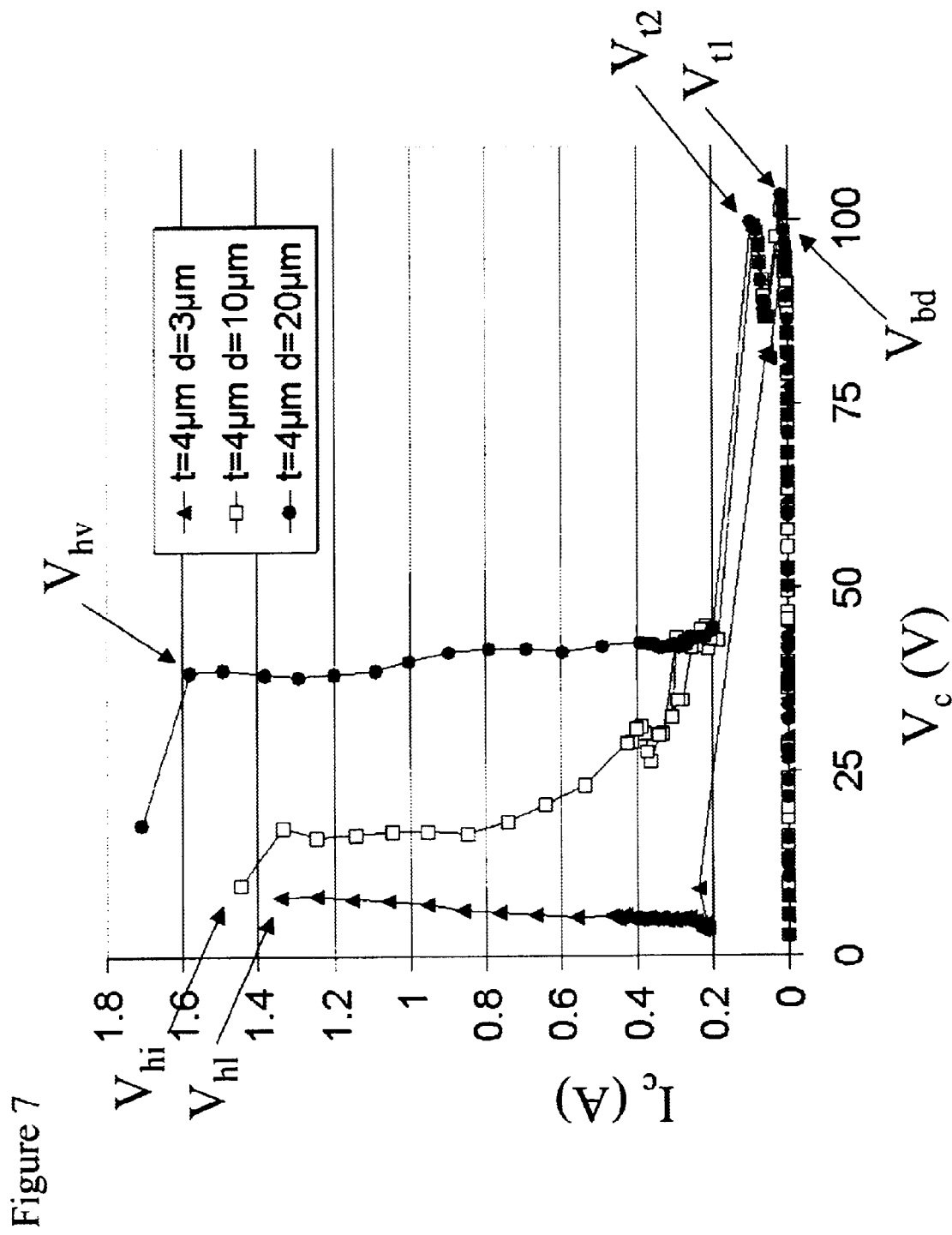
FIG. 7 shows the collector current $I_c$ (A)—collector voltage $V_c$ (V) curve illustrating influence of the layout parameter "d" on the electrical behaviour of an embodiment of the ESD structure according to the invention.

In the first embodiment of the invention, which is shown in FIGS. 4 and 5, the highly n-doped layer 12 is at least located underneath or at least overlaps the emitter region 9 and the collector region 15. The base width d of the lateral device is varied resulting in a corresponding change of holding voltage of the ESD structure. FIG. 7 shows the collector current-voltage characteristics of the ESD structure according to the present invention obtained by TLP for three different lateral base width "d" values: 3 μm, 10 μm and 20 μm. After an initial breakdown around 90V and triggering of the bipolar at 105V, the devices snap back to 85V, from where the voltage strongly increases again. Then around 100V, a second electrical snapback occurs, and the voltage drops to 5V for d=3 μm, to 40V for d=20 μm and changes gradually from 40V down to 10V for d=10 μm with increasing current.

A device with a lateral basewidth d=1 um can labelled as a short base device. The status in the ESD structure at the breakdown voltage point of such short base device before the first snapback occurs is as follows: the impact ionisation is located at the inversely polarised p-body 10/n-tub 11 junction near the surface of the p-substrate. Due to the impact ionisation additional charge carriers are generated and the corresponding avalanche current is flowing from the collector 15 to the base 8. Because both bipolar devices have the base in common, both devices will trigger at the same $V_{be}=R_{base}*I_b$ voltage, which is generated across the base resistance by the base current. The IV characteristics for the "t" array given in FIG. 15 show that "t" can very efficiently be used to control the breakdown voltage or trigger voltage of the structure by the reach-through effect but does substantially not influence the holding voltage. The use of controlling the trigger voltage of a lateral bipolar device by the layout parameter "t" was already disclosed in WO-A-99/21229.

At a higher voltage applied to the collector electrode 15, when the hole-avalanche current in the base region 10 is high enough to build up 0.7V under the emitter 9, this emitter-base junction becomes forwardly biased and electrons start to get injected in the base 10. Because of this new source of electrons, the ESD device may support the same current at a lower voltage and the first electrical snapback ($V_{t1}$ in FIG. 7) occurs. At that moment, the lateral bipolar device turns on, but the device is still in a low-current bipolar mode. The impact ionisation region is still located at the p-body/n-tub junction near the surface of the substrate (13) in which the ESD structure is formed.

When the collector current further increases, the base push-out effect arises. This effect appears when the mobile charge density at the depletion region of the base 10—collector 11 junction becomes higher than the fixed charge density in this depletion region. The base push-out results in a lateral extension of the base region into the n-tub 11, by which the ionisation region is pushed away from the p-body 10/n-tub 11 junction towards the collector n-well 14/n+ 15 gradient.

In these higher doped regions 14, 15, the multiplication or impact ionisation rate is higher compared to the lower doped n-tub region 11, so a lower electric field is enough to obtain the same avalanche current in the ESD device. The collector voltage then drops to bring the device in a second strong and purely electrical snapback state ($V_{t2}$ in FIG. 7). The device finally stabilises itself at a very low holding voltage of 5V to 10V ($V_{h1}$ in FIG. 7). This low holding voltage is thus related to the extremely high impact ionisation occurring at the n+ collector region 14–15.

After this second snapback, the current spreads deeper but flows still mainly laterally. So for d=1 μm, the ESD device behaviour is controlled by the lateral bipolar.

If the basewidth "d" of the lateral bipolar device is increased to 20 μm, the device behaves completely differently. Indeed, increasing "d" enlarges the base width of the lateral bipolar while for the vertical bipolar the base width W remains constant. As shown in FIG. 5b, which can be considered as the mask information of a BiCMOS process, the distance "d" can be changed by changing the layout. The vertical dimensions of the various dopant regions are process dependent and are fixed for a given process, e.g. given implant conditions and thermal budget. When the distance "d" is increased, the current path for both the lateral $I_{cl}$ and vertical current flow $I_{cv}$ (see FIG. 4) (12) becomes longer. This additional distance only adds the low vertical collector resistance of the highly doped BLN layer (12) to the total collector resistance $R_{cv}$ of the vertical device. Due to the absence of sinker or sink implantation, the total collector resistance of the vertical bipolar is highly deteriorated and to a large extent only determined by the portions $R_{cv1}$ and $R_{cv3}$ (see FIGS. 5a, 6). For the lateral device on the other hand the increase in base width "d" decreases the current gain $\beta_l$ of the lateral bipolar as this current gain is inversely proportional to the base width. For a given simplified BiCMOS process the lateral device will switch off at a given value of "d" and the vertical bipolar further takes the collector current. The current is now mainly flowing vertically via the BLN. Further, as the bipolar in the low-current regime is conducting vertically, no base push-out is possible laterally towards the n-well. If the collector current increases the base push-out occurs in the vertical direction, following the current flow, pushing the impact ionisation towards the BLN (12). When the impact ionisation region reaches the BLN-layer, again a second snapback occurs since the BLN layer (12) is much higher doped than the n-tub (11) part of the vertical collector region. But since the BLN doping level (12) is lower and much more gradual than that of the n+ (15)/n-well (14) region, the device snaps back to a higher holding voltage of 40V in the experiment ($V_{hv}$ in FIG. 7). This explains why the holding voltage of the ESD device, according the present invention, is much higher for the large "d" device than for the small "d".

In summary, by means of the parameter "d", the type of the bipolar-turn-on can be chosen and selected between the lateral and the vertical bipolar device, and associated to the bipolar conduction, the base push-out establishes itself differently. This leads to a different snapback as the region of reallocation and the amount of the impact ionisation is different. The holding voltage of the ESD structure is controlled by the bipolar conduction path. Which bipolar conduction path will be followed after triggering of the ESD structure is determined by the design parameter "d". A change in "d" will change the ratio in total current gain of the lateral and vertical bipolar device. The bipolar device yielding the highest collector current at a given voltage will dominate the current flow and determine the holding voltage. The collector current of bipolar device is determined by the impact ionisation rate, the current gain and the total collector resistance of the device. The feedback mechanism of each transistor is determined by the corresponding current gain and collector resistance. The current gain $\beta_l$ of the lateral device is determined by the concentration of p-body base region (10), n-tub (11)/n-well (14) collector concentration and the base width d. The current gain $\beta_v$ of the vertical device is determined by the concentration of the p-body base region (10), the concentration of the n-tub (11)/BLN (12) collector region and the base width W, which can easily by varied. Each impurity region will have a dopant gradient towards the p-substrate.

For intermediate values of d, both lateral and vertical bipolars are in competition with each other. When the current increases, it does for both the bipolars, simultaneously increasing the base push-out effect in both directions (lateral and vertical). However, as the lateral effect is stronger, the lateral bipolar is more enhanced than the vertical one leading to a larger proportion of current through the lateral than the vertical. As the lateral bipolar is becoming more and more dominant, it allows the voltage to drop from the vertical bipolar holding voltage to the lateral bipolar holding voltage, as shown on FIG. 7 by $V_{hi}$.

From ESD point of view the vertical bipolar device allows a better power dissipation and hence a good ESD robustness as the collector current $I_{cl}$ is deeply spread. As the vertical device will have a larger holding voltage $V_{hv}$, which in combination with this lower current density will give a small thermal dissipation, i.e. product of voltage and current. The lateral device will have a lower holding voltage $V_{hl}$, but have a higher current density, as the collector current $I_{cv}$ is only flowing at the surface.

Figure 8:
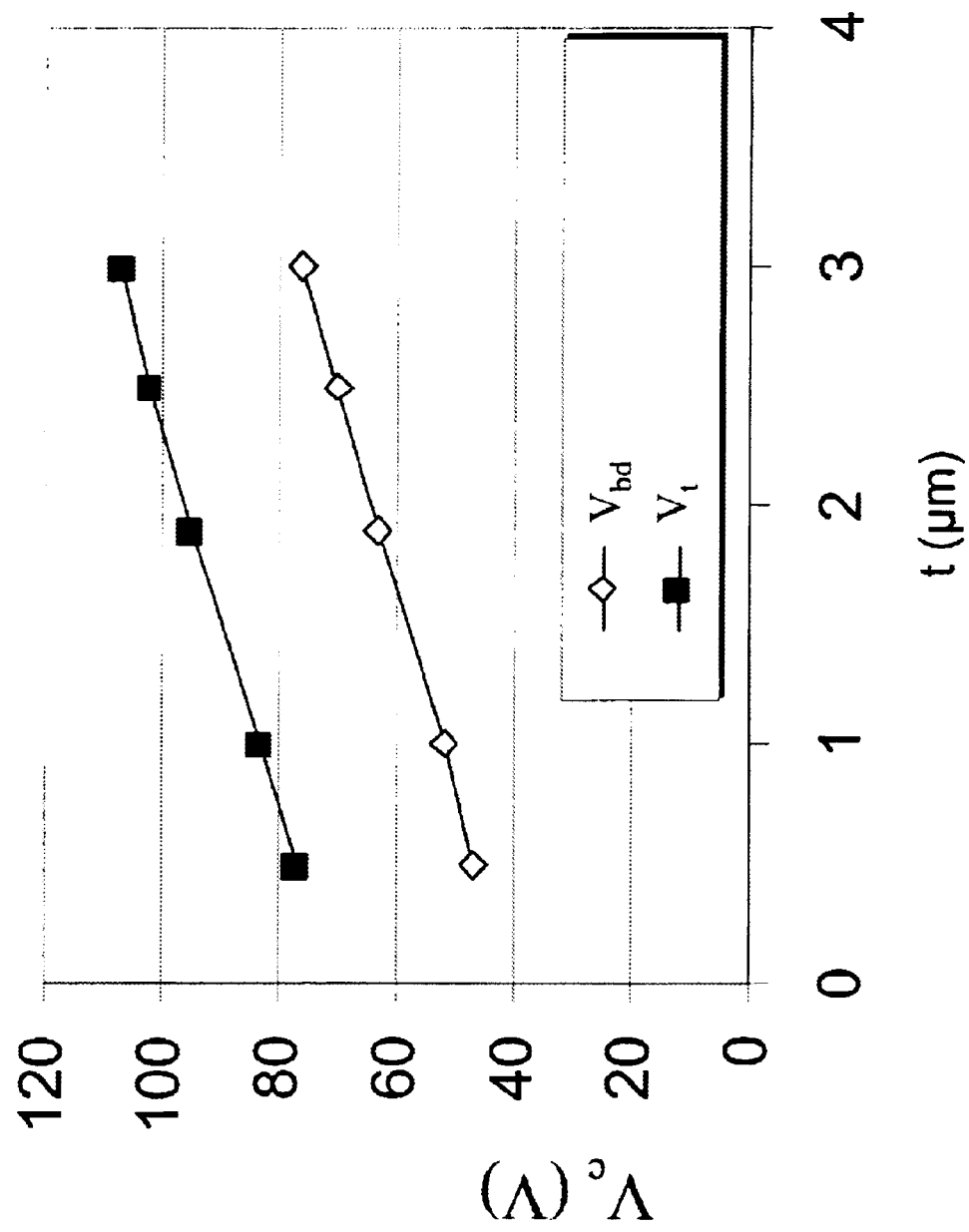
FIG. 8 shows the breakdown voltage and the trigger voltage dependence on the layout parameter "t" of an embodiment of the ESD structure according to the invention.
Figure 9:
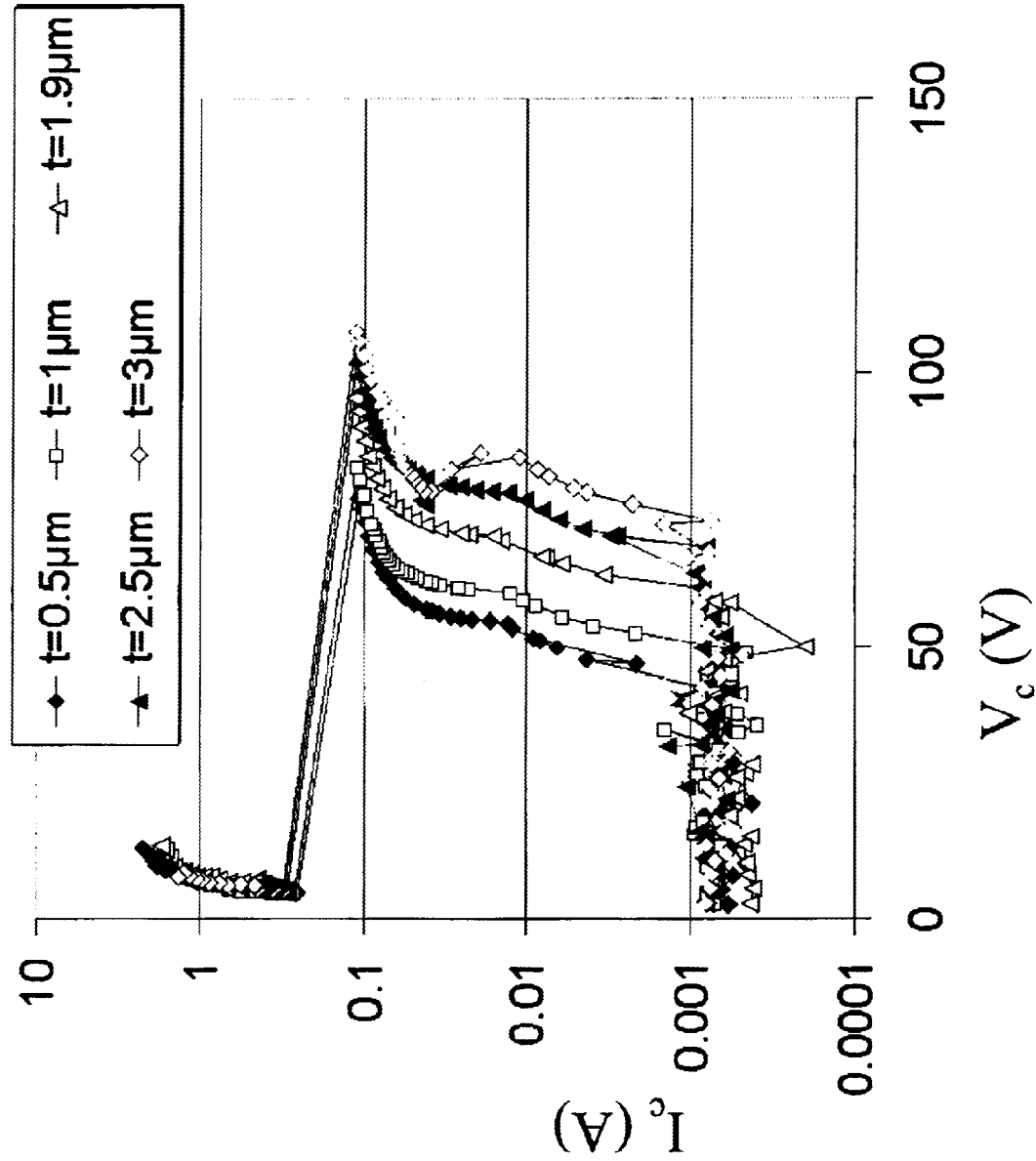
FIG. 9 shows the collector current-voltage (I/V) curve illustrating influence of the layout parameter "t" on the electrical behaviour of the ESD structure according to the invention.

The ESD performance of the ESD structuring offering a selectable holding voltage is very satisfactory both for the low and the high holding voltage as shown in FIG. 14. Due to its very low holding voltage (see FIG. 7), the short base device, d=3 μm, in which the holding voltage $V_{hl}$ is determined by the lateral device, shows very robust capabilities (1.3A/80 μm, i.e. 16 mA/μm) despite the fact that the current is flowing at the surface. Together with the possibility to tune the trigger voltage with the "t" parameter as shown in FIGS. 8 and 9, it makes this device a very attractive protection for I/Os. On the other hand, the large base device, d=20 μm, in which the holding voltage $V_{hv}$ is determined by vertical device, with a large holding voltage (40V) is a good protection device for supply buses and if the power dissipation is higher due to the high holding voltage, the structure is still robust since the current is spread deeply into the device.

Figure 10A:
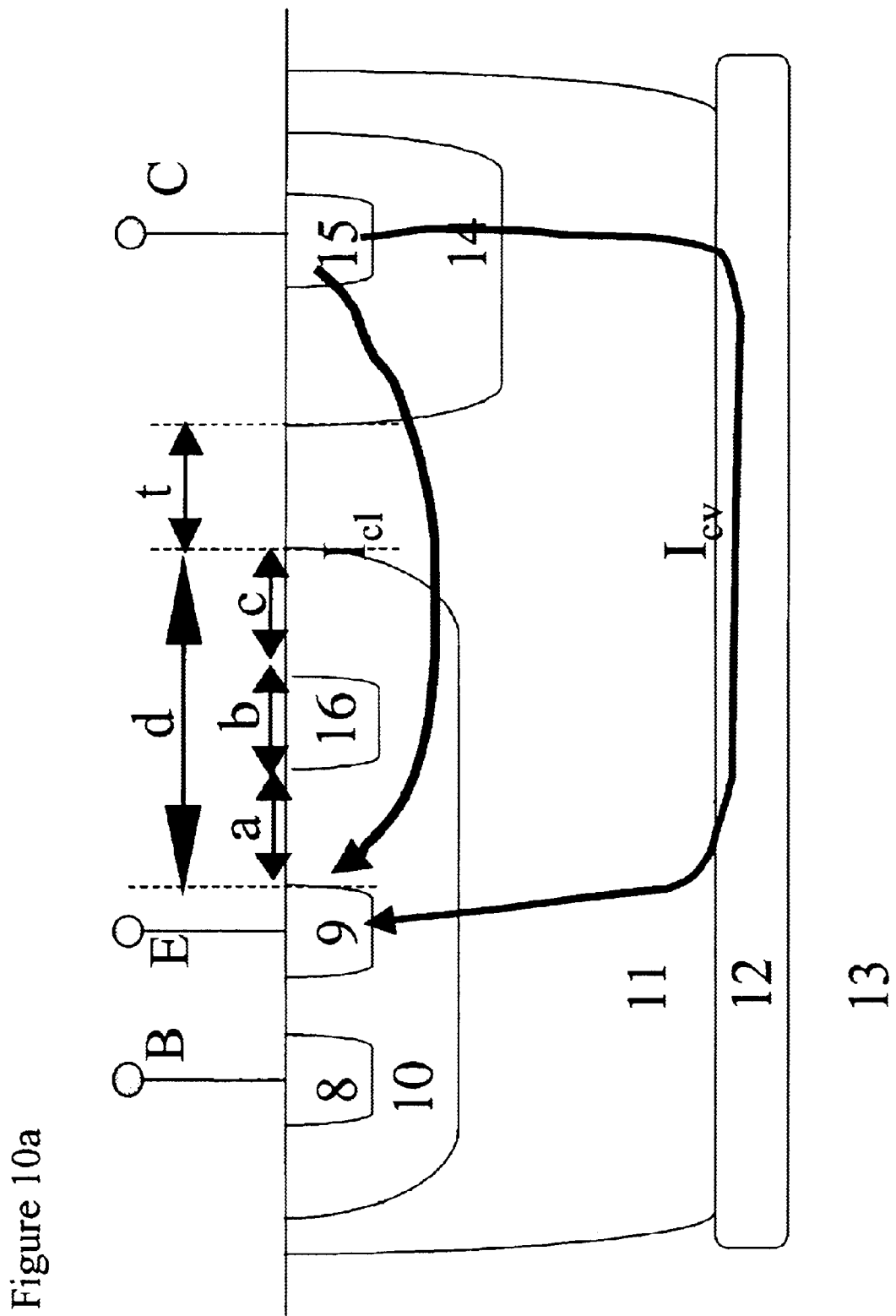
FIG. 10a shows a schematic cross-section of a lateral bipolar device manufactured in a simplified BiCMOS process, according to the present invention, the device having a further highly p-doped region.
Figure 10B:
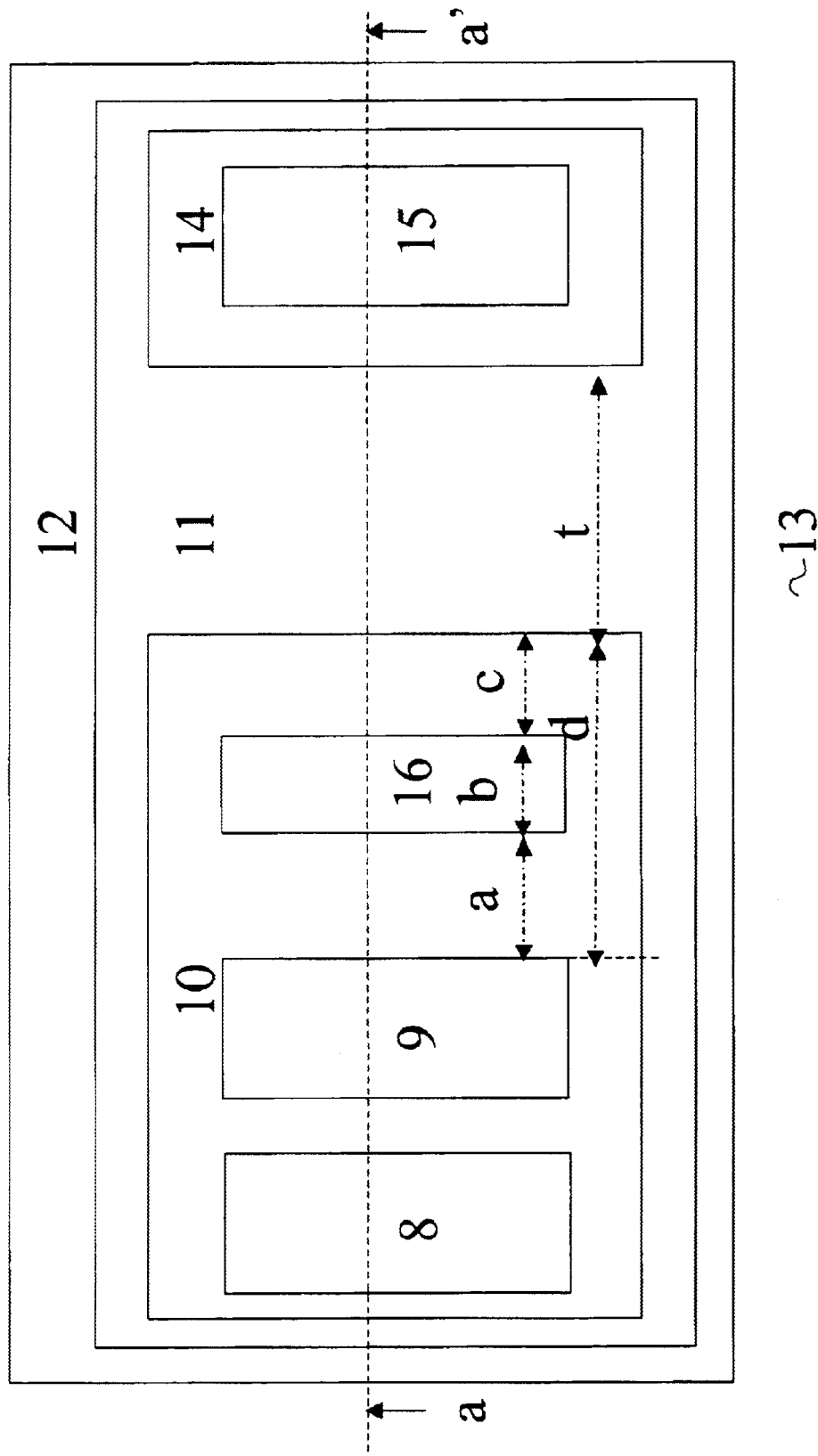
FIG. 10b shows a schematic top view of the device shown in FIG. 10a, A—A' being the line on which the cross section of FIG. 10a is taken.

In a second embodiment of the invention, shown in FIGS. 10a–b, the base width "d" of the lateral device is modulated by introducing a second highly p-doped region 16 in the base region overlapping the emitter region 9. As explained in the first embodiment of the first aspect a base width "d" of 20 to 30 m is required for the given BiCMOS technology in order to have the vertical bipolar device switched on and have a high holding voltage. The area of the ESD structure will be very large for a high holding voltage. The consequence of increasing "d" for a higher holding voltage is that the size of the protection structure suffers from the competition between the lateral and the vertical bipolar transistor. As a result, it is desired to reduce the operation of the lateral device without increasing its physical base width "d". This size issue can be overcome by introducing the floating, i.e. unbiased, p+ diffusion region 16, with the purpose of deteriorating the working of the lateral transistor while keeping a high holding voltage. Due to this floating p+ diffusion region 16, the electrical base width $d_e$ of the lateral device is larger than its physical or layout-determined base width d. The introduction of the floating p+ diffusion region 16 heavily dopes the base region 10 of the lateral transistor without impacting the profile of the vertical device. The direct consequence is that the current gain of the lateral transistor is now worse and allows the vertical one to trigger first. The cross section is shown in FIG. 10a and the corresponding top view in FIG. 10b. The introduction of this highly doped p+ region 16 only requires a change in the layout of the device. The p+ implant 16 can be the same as and done simultaneously with the p+ contact region 8 and/or the source/drain implants of the MOS devices manufactured in this BiCMOS process. This structure allows in a limited area (d=$d_a$+$d_b$+$d_c$<10 micrometer) to obtain a high holding voltage of 40 Volts, which is a very nice achievement for a high voltage technology without using sinkers.

The holding voltage of the device of the invention can be further modified as shown in the embodiments of FIGS. 11a–b and 14a–b. In this embodiment, the highly n-doped layer 12 is at least located underneath the collector contact region 15 and is spaced apart from the emitter region 9 by a lateral distance "b". As in the previous embodiment the feedback mechanism of the bipolar device is modified, now by varying or modulating the vertical collector resistance. This varying is again obtained by only changing a layout parameter, i.e. the spacing "b" between the BLN region 12 and the emitter region 9. The same effect can be achieved by providing the spacing on the other side of the BLN 12, i.e. spacing the BLN 12 apart from the collector contact region 15 by a lateral distance "c", as is for example shown in the embodiment of FIGS. 15a–b. Both parameters "b" and "c" may also be combined.

Figure 11A:
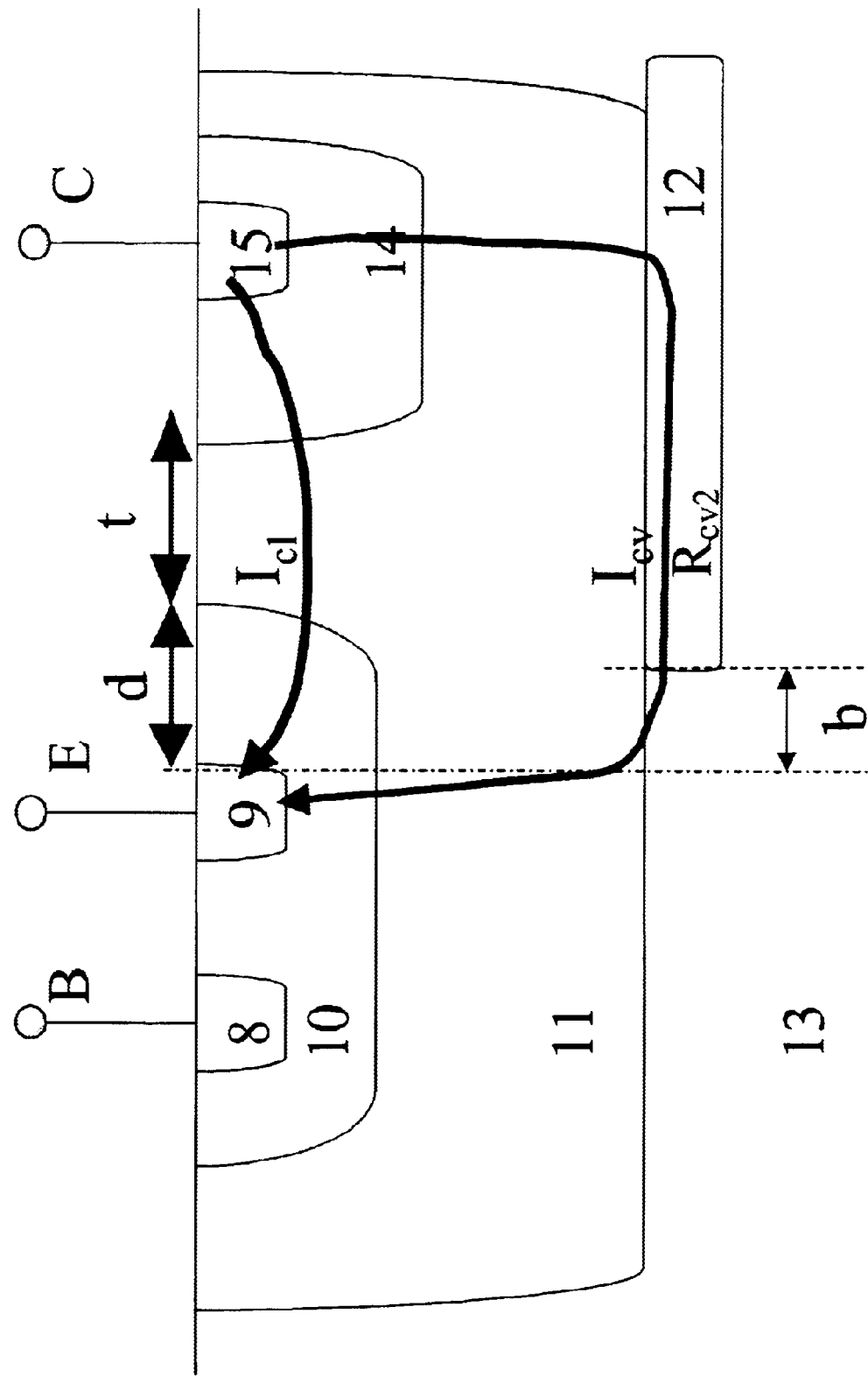
FIG. 11a shows a schematic cross-section of a lateral bipolar device manufactured in a simplified BiCMOS process, according to the present invention, the device being modified by a further layout parameter "b".
Figure 11B:
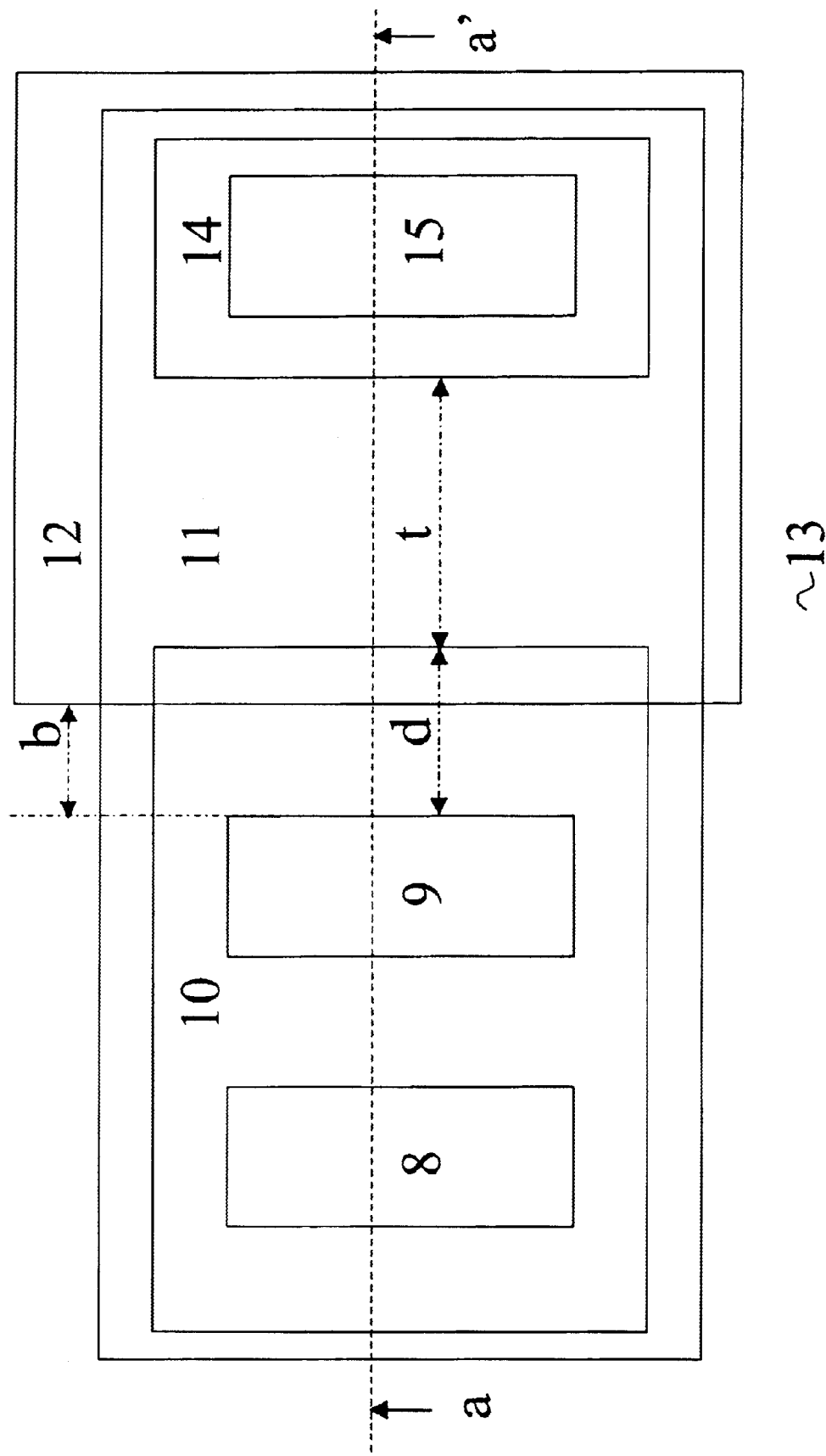
FIG. 11b shows a schematic top view of the device shown in FIG. 11a, A—A' being the line on which the cross section of FIG. 11a is taken.

The embodiment shown in FIGS. 11a–b is very similar to the embodiment of FIGS. 4 and 5 except that the BLN layer 12 is partly omitted. The parameter "b" defines the region of the omission. By only using a partly BLN region 12 the $R_{CV2}$ portion of the vertical collector resistance is decreased, which was already low resistive, and the portion $R_{CV1}$ is increased which was high resistive, so that the total collector resistance of the vertical device is increased. This modulation of the collector resistance of the vertical device will determine which device, lateral or vertical, is turned on and if the vertical device is turned on which holding voltage is obtained. This holding voltage will depend on the given current gain and collector resistance.

Figure 12:
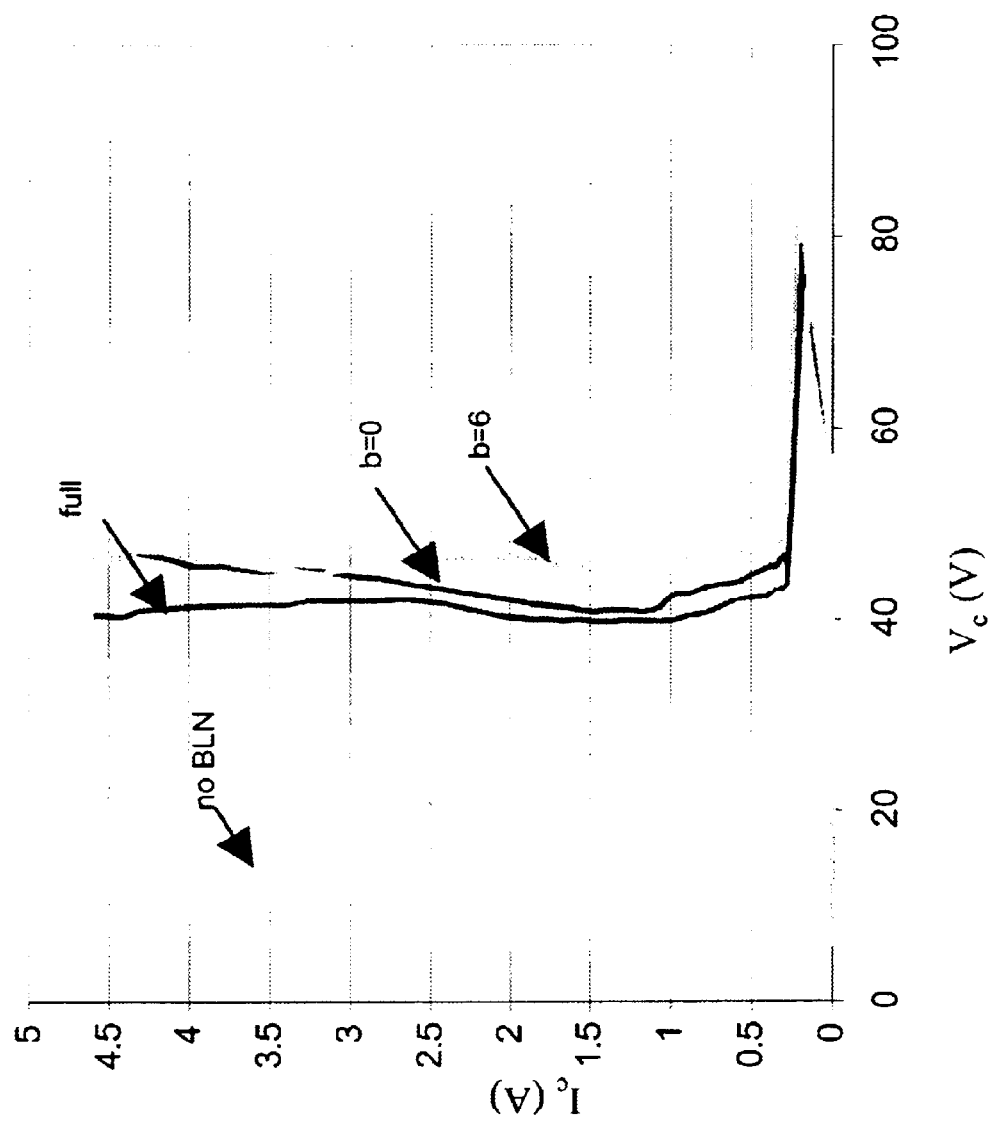
FIG. 12 shows the collector current-voltage (I/V) curve illustrating influence of the layout parameter "b", for t=0.5 micrometer and d=20 micrometer, on the electrical behaviour of the ESD structure according to the invention.

FIG. 12 shows that the parameter "b" allows to vary the holding voltage. If no BLN is present the lateral device is triggered and will determine the holding voltage. If a BLN is at least partially present in between the collector contact 14 and the emitter 9, the vertical transistor can be triggered and determines the holding voltage. A change in b will change the collector resistance and hence the holding voltage. If the vertical device is triggered (e.g. d=20 um) then the holding voltage of this device which is function of the current gain $\beta_v$ and of the collector resistance $R_{cv}$ will vary with "b". If the vertical device is too much degraded, then the lateral device will be triggered even if "d" is large.

In a further embodiment of the device of the invention, the doping level of the base region is changed without changing the given BiCMOS process. As shown in FIGS. 13–15 the p-body 10 is replaced by a p-well 17. As normally the p-well dimensions are generated out of the n-well design info, the p-well is touching the n-well and the parameter "t" has no meaning anymore. In an automated mask generation environment, the p-well is defined as the inverse of the n-well and only the n-well regions are laid out, while the p-well regions will be calculated by the design program. The trigger voltage cannot be modified and is fixed for a given technology. The parameter "d" remains valid and is also used to control the holding voltage as explained above with regard to the other embodiments of the device of the invention.

Figure 13A:
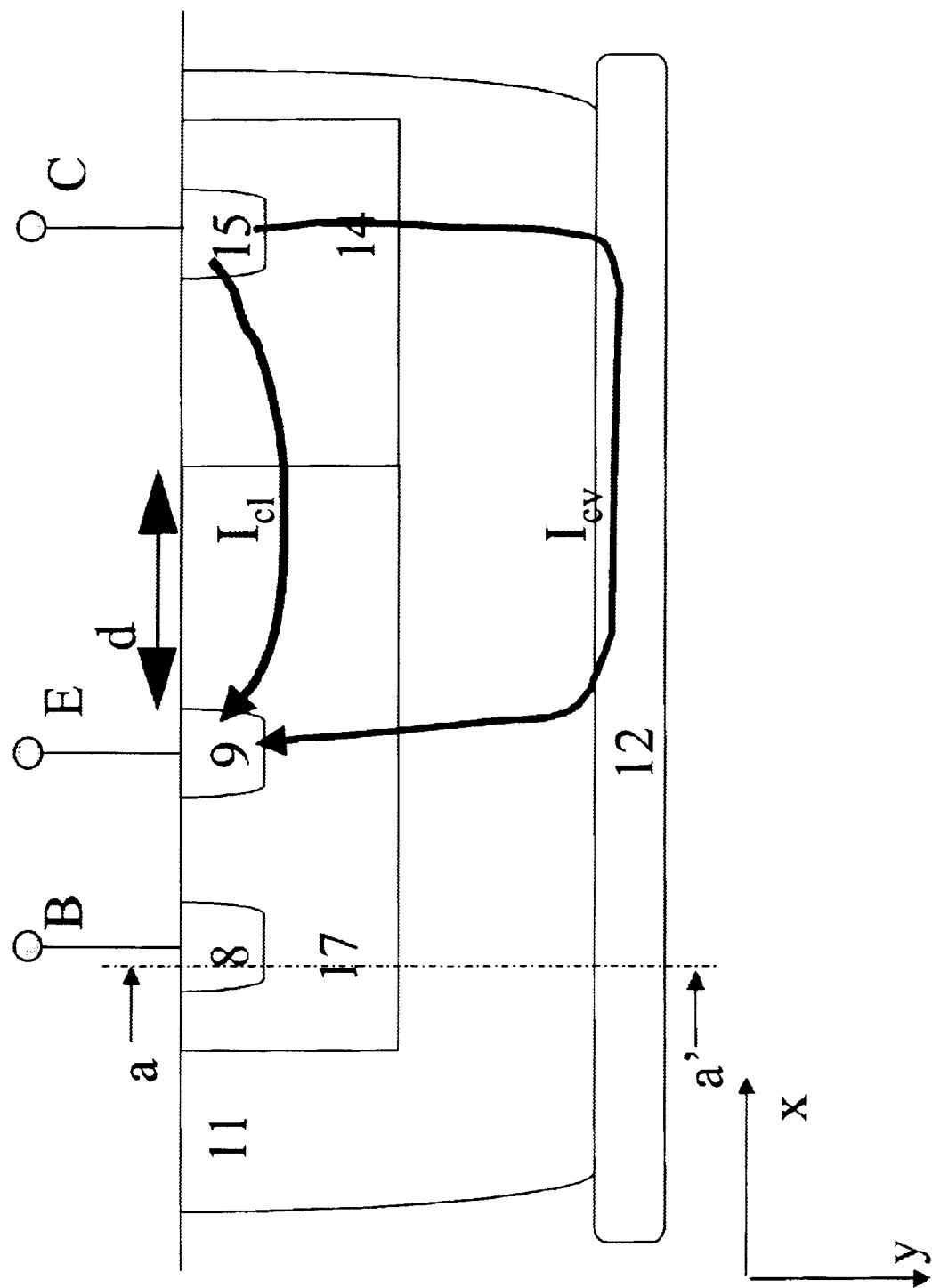
FIG. 13a shows a schematic cross-section of a lateral bipolar device manufactured in a simplified BiCMOS process, according to the present invention, in which the parameter "t"=0.
Figure 13B:
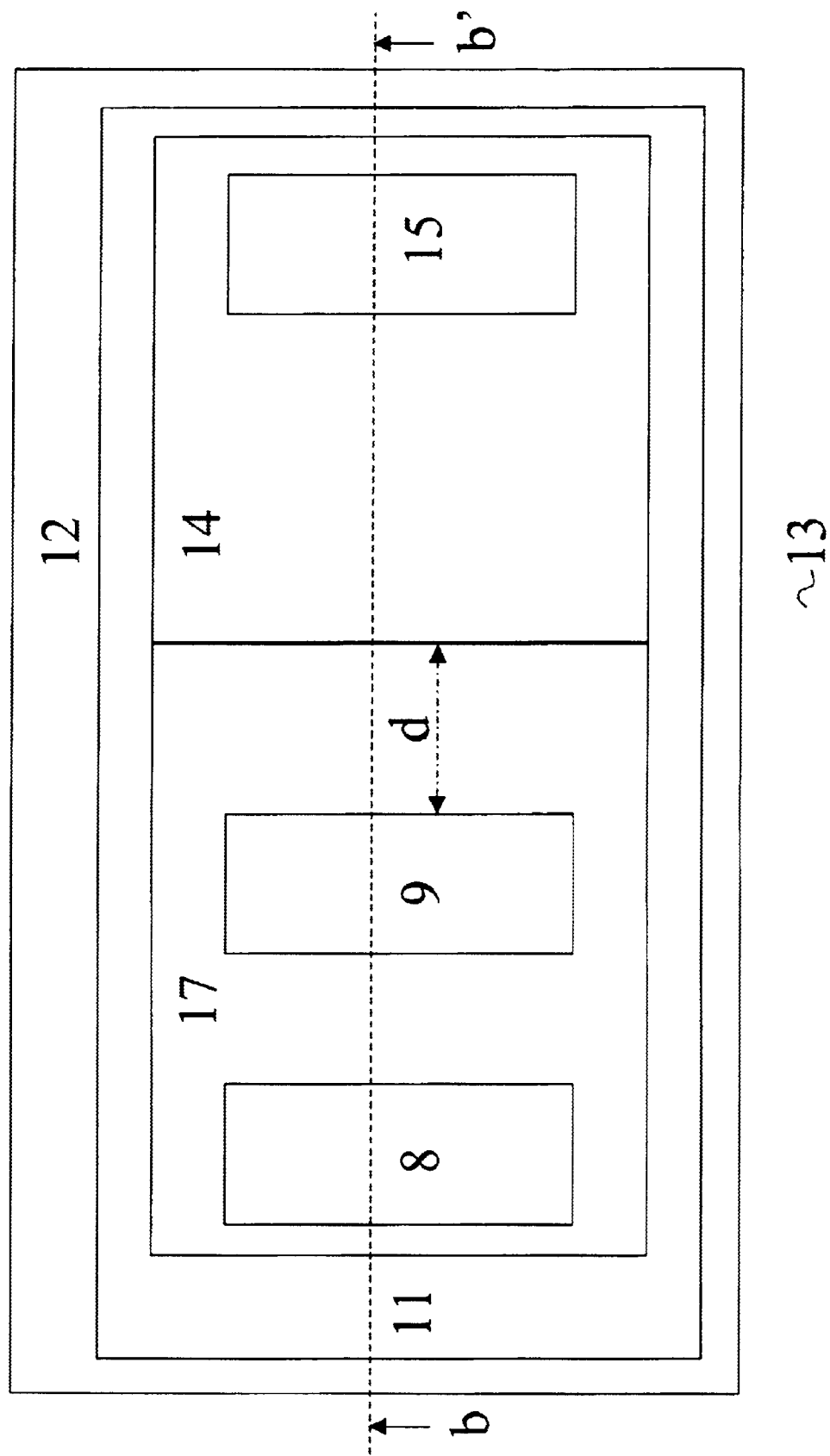
FIG. 13b shows a schematic top view of the device shown in FIG. 13a, A—A' being the line on which the cross section of FIG. 13a is taken.
Figure 13C:
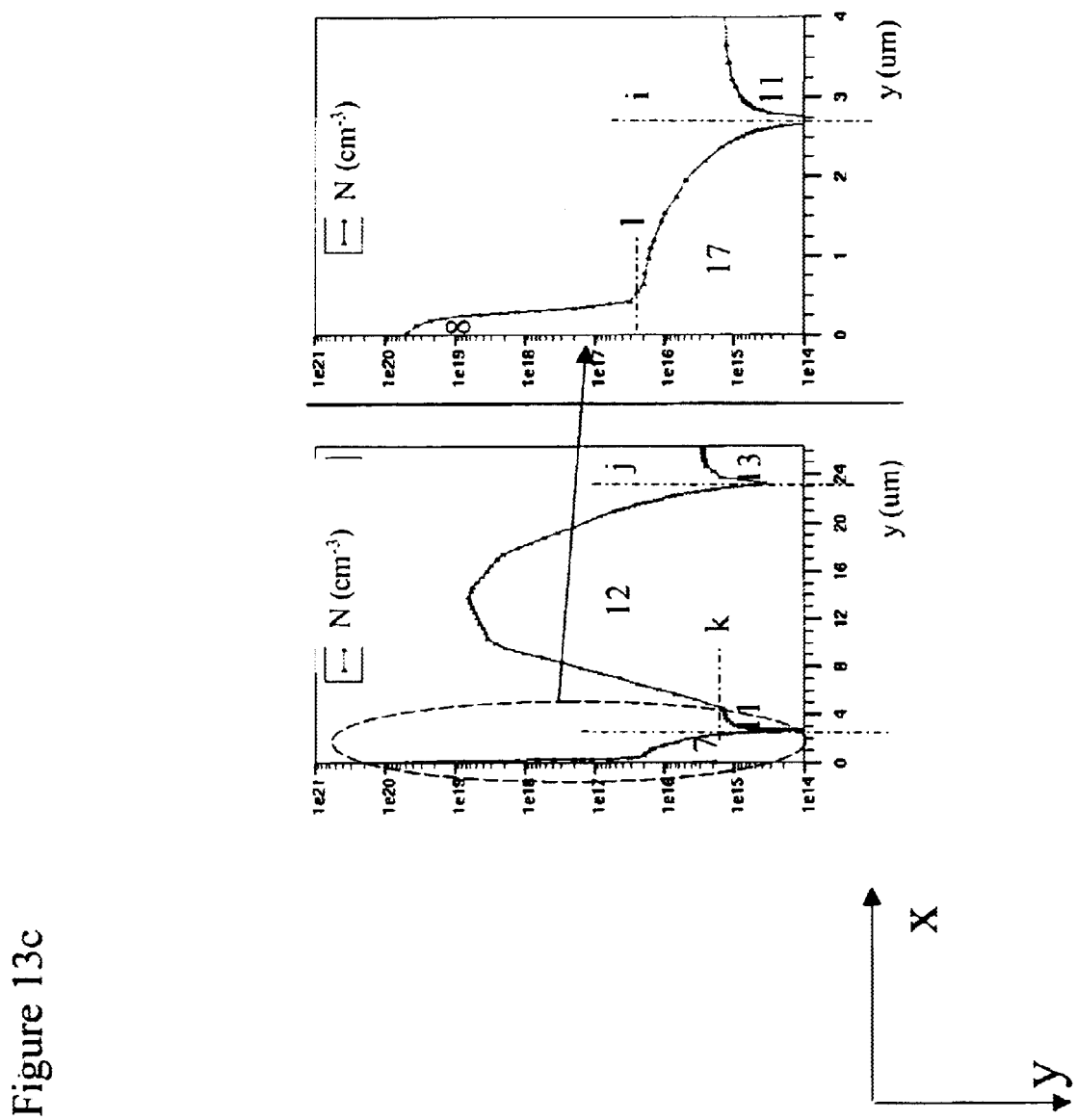

In the embodiment of FIGS. 13a–b (cross section and top view) a full highly n-doped layer 12 is present underneath and extending from the emitter region 9 to the collector region 15.

Figure 14A:
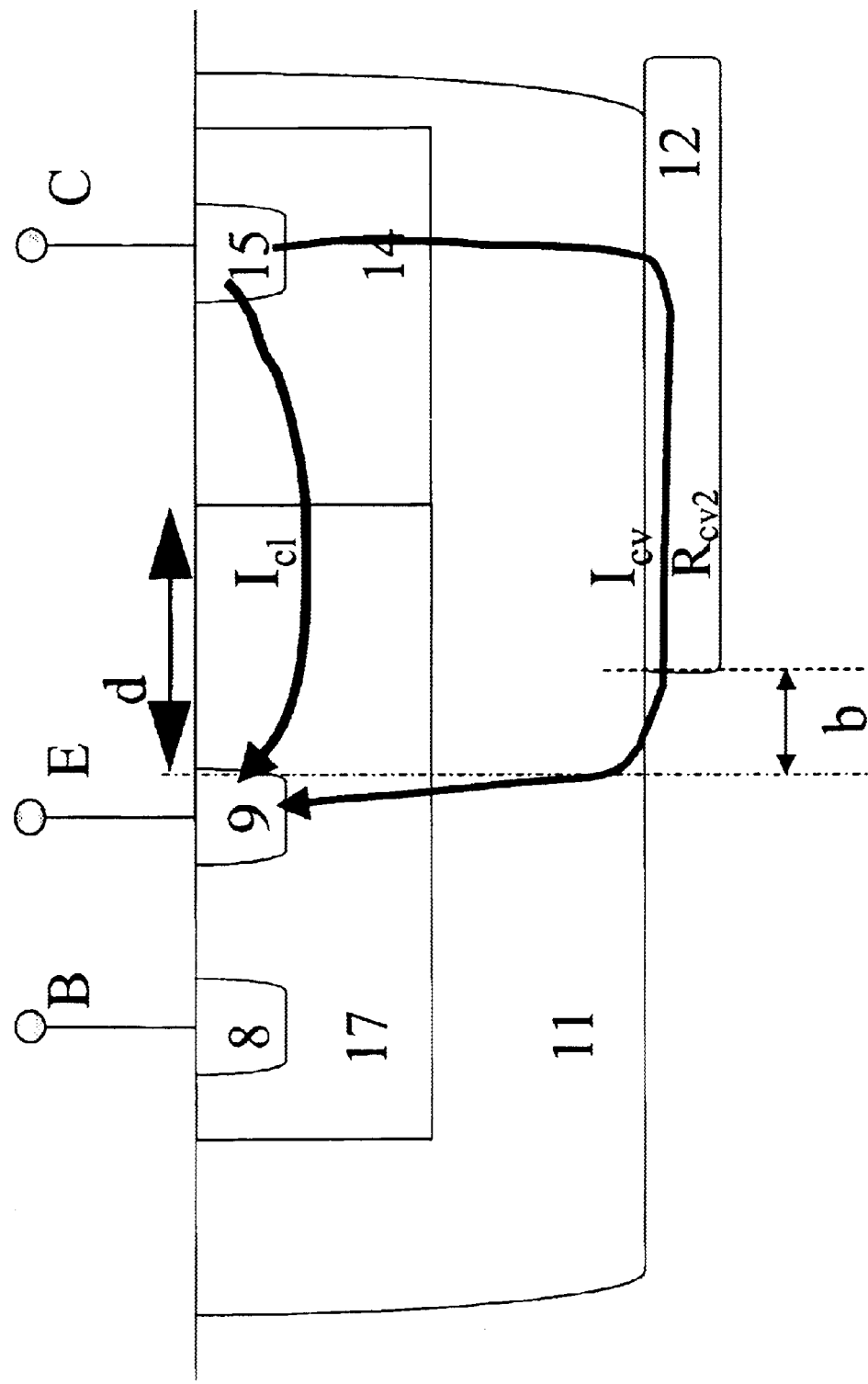
FIG. 14a shows a schematic cross-section of a lateral bipolar device manufactured in a simplified BiCMOS process, according to the present invention, in which the parameter "t"=0 and the device is modified by the parameter "b".
Figure 14B:
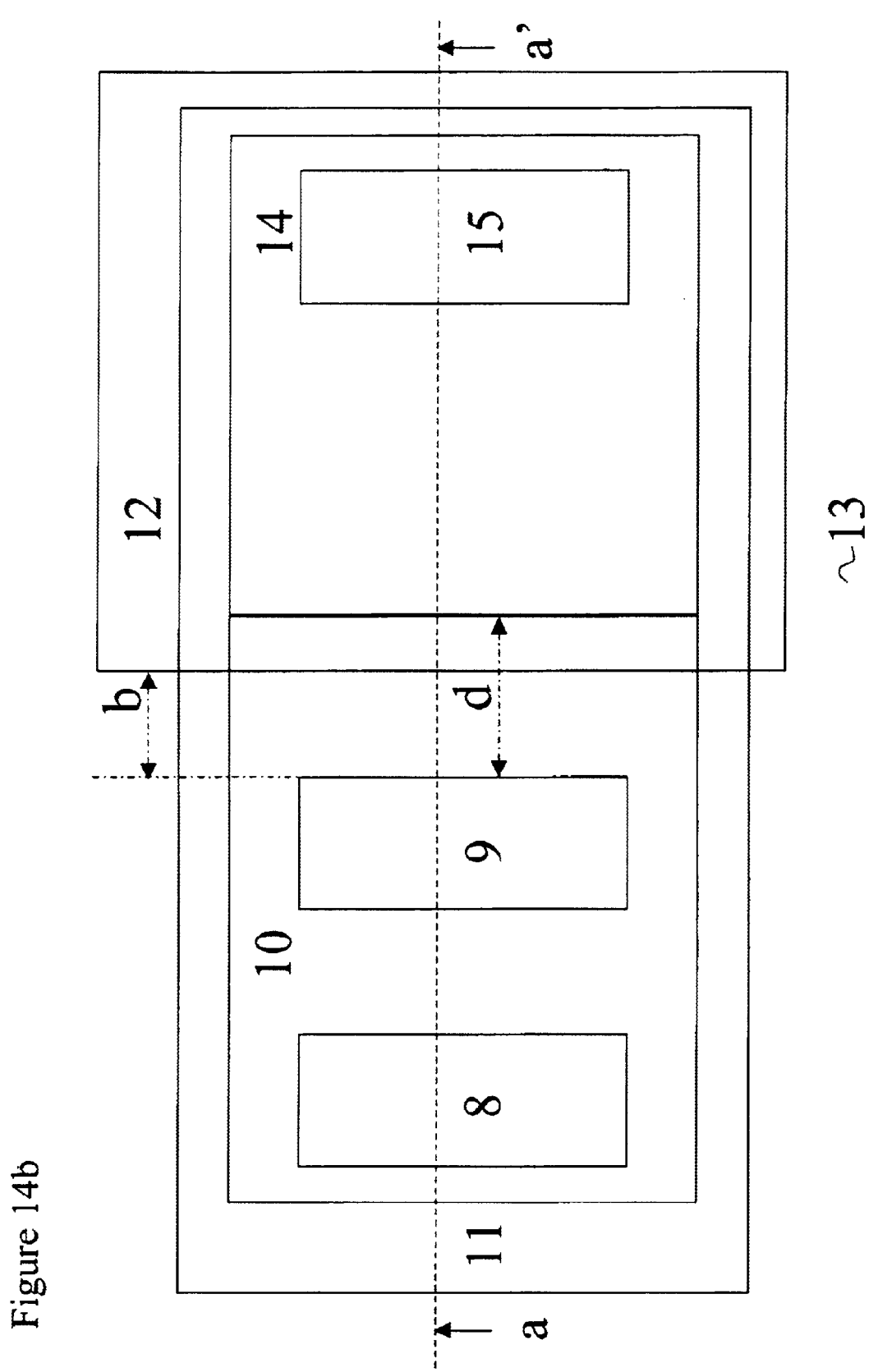
FIG. 14b shows a schematic top view of the device shown in FIG. 14a, A—A' being the line on which the cross section of FIG. 14a is taken.
Figure 15A:
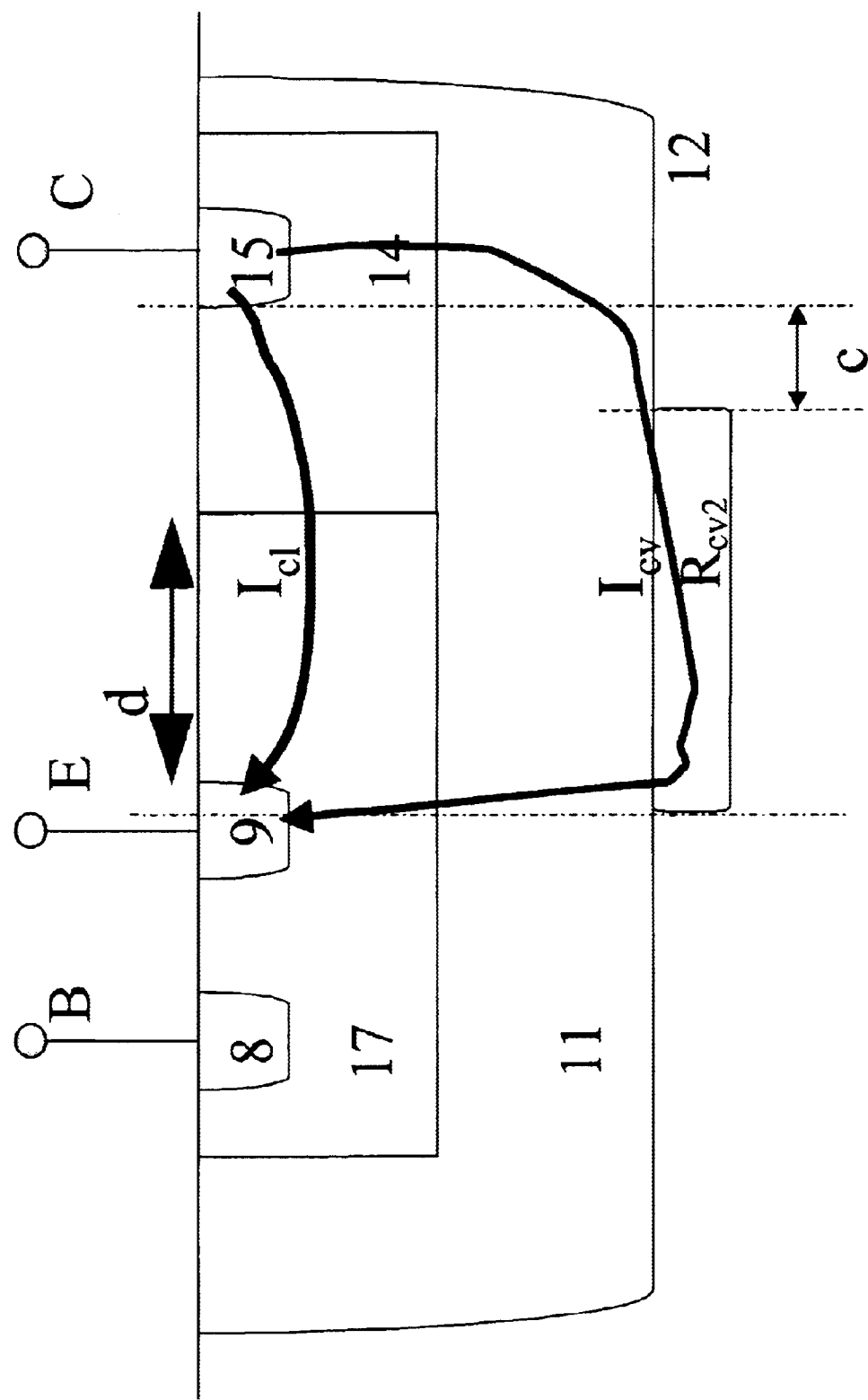
FIG. 15a shows a schematic cross-section of a lateral bipolar device manufactured in a simplified BiCMOS process, according to the present invention, the device being modified by the parameter "c".
Figure 15B:
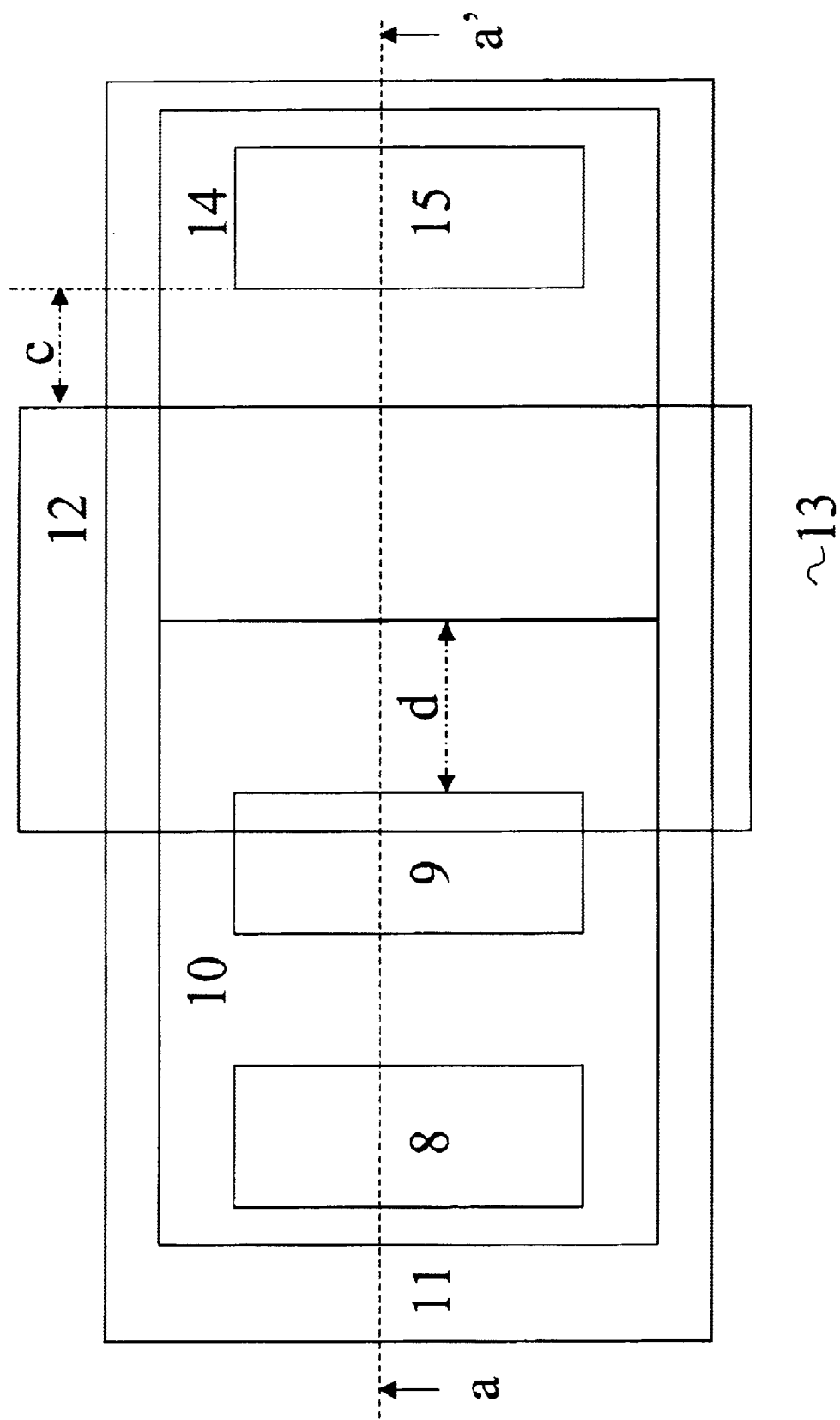
FIG. 15b shows a schematic top view of the device shown in FIG. 15a, A—A' being the line on which the cross section of FIG. 15a is taken.

In the embodiments of FIGS. 14a–b (cross section and top view), resp. 15a–b (cross section and top view), a partial highly n-doped layer 12 is present. Again the collector resistance of the vertical bipolar device is changed by changing the spacing b, resp. c between this highly doped layer 12 and the emitter region 9, resp. the collector contact region 9. The influence of the b and c parameters is already disclosed with respect to the above-described embodiment of FIGS. 11a–b.

An exemplary embodiment of the present invention has been illustrated and described. It will be understood, however, that changes and modifications may be made to the invention without deviating from the scope of the invention, as defined by the following claims. Further, the claims should not be read as limited to the described order of elements unless stated to that effect. Therefore, all embodiments that come within the scope and spirit of the following claims and equivalents thereto are claimed as the invention.

TABLE 1

| Electrical parameter | I/O structure | Power Supply Structure |
| --- | --- | --- |
| Breakdown voltage | >40 V | >40 V |
| Trigger voltage | <80 V | <100 V |
| Holding voltage | Na | >40 V |

We claim:

1. ESD protection device comprising:

a first highly p-doped region with a base contact;

a first highly n-doped region with a collector contact;

a second highly n-doped region with an emitter contact and located between the first highly p-doped region and the first highly n-doped region;

a weakly p-doped region;

a weakly n-doped region;

a more weakly n-doped region; and a highly n-doped buried layer, wherein the first highly p-doped region and the second highly n-doped region are formed in the weakly p-doped region which has a lateral overlap extending towards the first highly n-doped region, the lateral overlap having a predetermined width, wherein the first highly n-doped region is formed in the weakly n-doped region, wherein the weakly p-doped region and the weakly n-doped region are formed in the more weakly n-doped region, wherein the highly n-doped buried layer is located underneath the more weakly n-doped region and extending below at least a portion of the weakly n-doped region and at least a portion of the weakly p-doped region, wherein the first highly p-doped region has a doping concentration above that of the weakly p-doped region, wherein the first highly n-doped region has a doping concentration above that of the weakly n-doped region, which in turn has a doping concentration above that of the more weakly n-doped region, wherein the highly n-doped buried layer has a doping concentration above that of the weakly n-doped region, wherein the device enables a lateral current component from the first highly n-doped region in the direction of the second highly n-doped region and a vertical current component from the first highly n-doped region via the buried layer in the direction of the second highly n-doped region, wherein the weakly n-doped region is separated from the buried layer by at least a part of the more weakly n-doped region, and wherein the width of the lateral overlap of the weakly p-doped region is determined in function of a predetermined ratio between the lateral current component and the vertical current component.

2. ESD device according to claim 1, wherein a first sequence of the second highly n-doped region, the weakly p-doped region, the weakly n-doped region and the first highly n-doped region forms a lateral transistor for enabling the lateral current component, and wherein a second sequence of the second highly n-doped region, the weakly p-doped region, the more weakly n-doped region and the highly n-doped buried layer forms a vertical transistor for enabling the vertical current component.

3. ESD device according to claim 2, wherein the more weakly n-doped region separates the weakly p-doped region and the weakly n-doped region by a first predetermined distance, said distance being chosen in function of a desired trigger voltage of the device in use.

4. ESD device according to claim 3, wherein a second highly p-doped region is formed in the lateral overlap of the weakly p-doped region, the second highly p-doped region having a doping concentration above that of the weakly p-doped region.

5. ESD device according to claim 4, wherein the buried layer is laterally separated from the second highly n-doped region by a second predetermined distance.

6. ESD device according to claim 5, wherein the buried layer is laterally separated from the first highly n-doped region by a third predetermined distance.

7. ESD device according to claim 6, wherein the weakly p-doped region separates the first highly p-doped region from the second highly n-doped region.

8. ESD device according to claim 7, wherein the weakly p-doped region contacts the weakly n-doped region.

9. ESD device according to claim 8, wherein the p-doped regions are replaced by n-doped regions and vice versa.

10. A device comprising first and second ESD devices according to claim 1, a width of the lateral overlap of the first ESD device being different from that of the second ESD device.

11. A method for determining the ratio between a lateral current component and a vertical current component in an ESD protection device comprising:

a first highly p-doped region with a base contact;

a first highly n-doped region with a collector contact;

a second highly n-doped region with an emitter contact and located between the first highly p-doped region and the first highly n-doped region;

a weakly p-doped region;

a weakly n-doped region;

a more weakly n-doped region; and a highly n-doped buried layer, wherein the first highly p-doped region and the second highly n-doped region are formed in the weakly p-doped region which has a lateral overlap extending towards the first highly n-doped region, the lateral overlap having a predetermined width, wherein the first highly n-doped region is formed in the weakly n-doped region, wherein the weakly p-doped region and the weakly n-doped region are formed in the more weakly n-doped region, wherein the highly n-doped buried layer is located underneath the more weakly n-doped region and extending below at least a portion of the weakly n-doped region and at least a portion of the weakly p-doped region, wherein the first highly p-doped region has a doping concentration above that of the weakly p-doped region, wherein the first highly n-doped region has a doping concentration above that of the weakly n-doped region, which in turn has a doping concentration above that of the more weakly n-doped region, wherein the highly n-doped buried layer has a doping concentration above that of the weakly n-doped region, and wherein the lateral current component is the current from the first highly n-doped region in the direction of the second highly n-doped region and the vertical current component is the current from the first highly n-doped region via the buried layer in the direction of the second highly n-doped region, the method comprising the step of:
  determining a ratio between the lateral current component and the vertical current component by varying the width of the lateral overlap of the weakly p-doped region.

* * * * *